US011239021B2

(12) United States Patent
Nakajima et al.

(10) Patent No.: US 11,239,021 B2
(45) Date of Patent: Feb. 1, 2022

(54) ISOLATED CONVERTER

(71) Applicant: Mitsubishi Electric Corporation, Tokyo (JP)

(72) Inventors: Koji Nakajima, Tokyo (JP); Shota Sato, Tokyo (JP); Yuji Shirakata, Tokyo (JP); Kenta Fujii, Tokyo (JP); Jun Tahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 509 days.

(21) Appl. No.: 16/310,667

(22) PCT Filed: Mar. 10, 2017

(86) PCT No.: PCT/JP2017/009795
§ 371 (c)(1),
(2) Date: Dec. 17, 2018

(87) PCT Pub. No.: WO2017/221476
PCT Pub. Date: Dec. 28, 2017

(65) Prior Publication Data
US 2019/0180923 A1 Jun. 13, 2019

(30) Foreign Application Priority Data
Jun. 24, 2016 (JP) .............................. JP2016-125169

(51) Int. Cl.
*H01F 27/28* (2006.01)
*H02M 3/28* (2006.01)
(Continued)

(52) U.S. Cl.
CPC ......... *H01F 27/2876* (2013.01); *H01F 27/24* (2013.01); *H01F 27/28* (2013.01);
(Continued)

(58) Field of Classification Search
CPC ...... H01F 27/2876; H01F 27/28; H01F 30/10; H01F 27/24; H01F 27/2804;
(Continued)

(56) References Cited

U.S. PATENT DOCUMENTS 5,929,733 A 7/1999 Anzawa et al.
5,949,321 A * 9/1999 Grandmont ......... H01F 27/2804
336/232
(Continued)

FOREIGN PATENT DOCUMENTS

CN 204614643 U 9/2015
JP 2002-015927 A 1/2002
(Continued)

OTHER PUBLICATIONS

Office Action dated Apr. 23, 2020, issued in corresponding Chinese Patent Application No. 201780037770.5, 15 pages including 8 pages of English translation.
(Continued)

*Primary Examiner* — Mang Tin Bik Lian
(74) *Attorney, Agent, or Firm* — Buchanan Ingersoll & Rooney PC

(57) ABSTRACT

An isolated converter reduced in size compared with a conventional isolated converter and having a high heat dissipation characteristic is provided. The isolated converter includes a multilayer substrate having a first through hole and a magnetic core partially passing through the first through hole. The multilayer substrate includes a first conductor pattern formed at a position overlapping the magnetic core on a second surface when viewed from a direction orthogonal to a first surface, a second conductor pattern formed between the first surface and the second surface at a position overlapping the magnetic core and the first conductor pattern when viewed from the direction orthogonal to the
(Continued)

first surface, at least one thermal conductive member formed on the first conductor pattern and having a portion disposed between the multilayer substrate and the magnetic core, and an electric insulating layer electrically insulating the first conductor pattern from the second conductor pattern.

14 Claims, 14 Drawing Sheets

(51) Int. Cl.
*H01F 30/10* (2006.01)
*H01F 27/24* (2006.01)
*H01F 27/00* (2006.01)
*H01F 27/02* (2006.01)
*H02M 3/335* (2006.01)

(52) U.S. Cl.
CPC ......... *H01F 27/2804* (2013.01); *H01F 30/10* (2013.01); *H02M 3/28* (2013.01); *H01F 27/008* (2013.01); *H01F 27/025* (2013.01); *H01F 2027/2809* (2013.01); *H02M 3/335* (2013.01)

(58) Field of Classification Search
CPC ............. H01F 27/025; H01F 27/008; H01F 2027/2809; H02M 3/28; H02M 3/335
See application file for complete search history.

(56) References Cited

U.S. PATENT DOCUMENTS

| | | | | |
|---|---|---|---|---|
| 6,000,128 | A | | 12/1999 | Umeno et al. |
| 6,005,773 | A | * | 12/1999 | Rozman .................. H02M 3/00 361/707 |
| 6,380,836 | B2 | * | 4/2002 | Matsumoto ........... H02M 3/335 336/200 |
| 7,468,648 | B2 | * | 12/2008 | Springett ................. H01F 27/22 336/200 |
| 9,788,410 | B2 | * | 10/2017 | Uchiyama ............ H05K 7/1432 |
| 2002/0003715 | A1 | | 1/2002 | Matsumoto et al. |
| 2009/0243782 | A1 | * | 10/2009 | Fouquet .............. H04L 25/0266 336/200 |
| 2010/0164670 | A1 | | 7/2010 | Nakahori et al. |
| 2011/0037405 | A1 | * | 2/2011 | Suganuma ............ H02M 7/003 315/276 |
| 2011/0102121 | A1 | | 5/2011 | Otsuka et al. |
| 2012/0081202 | A1 | * | 4/2012 | Nanayakkara .......... H01F 19/04 336/200 |
| 2012/0161911 | A1 | | 6/2012 | Moiseev et al. |
| 2012/0195005 | A1 | * | 8/2012 | Asano ..................... H01F 27/22 361/710 |
| 2015/0116963 | A1 | | 4/2015 | Hachiya et al. |
| 2015/0302972 | A1 | * | 10/2015 | Yonezawa ........... H01F 27/2804 363/21.16 |
| 2016/0035480 | A1 | | 2/2016 | Hachiya et al. |
| 2016/0035481 | A1 | * | 2/2016 | Hachiya ................. H05K 1/165 336/61 |
| 2017/0310228 | A1 | | 10/2017 | Nakajima et al. |
| 2018/0047497 | A1 | | 2/2018 | Miyakawa et al. |

FOREIGN PATENT DOCUMENTS

| | | |
|---|---|---|
| JP | 2008-004823 A | 1/2008 |
| JP | 2008-054449 A | 3/2008 |
| JP | 2010-109309 A | 5/2010 |
| JP | 2012-134424 A | 7/2012 |
| JP | 2012-156461 A | 8/2012 |
| JP | 2013-150414 A | 8/2013 |
| JP | 2014-138079 A | 7/2014 |
| JP | 2014-192517 A | 10/2014 |
| JP | 2014-199908 A | 10/2014 |
| JP | 2014-199909 A | 10/2014 |
| JP | 2014-207406 A | 10/2014 |
| JP | 2015-133440 A | 7/2015 |
| JP | 6008160 B1 | 10/2016 |
| WO | 2004/040599 A1 | 5/2004 |
| WO | 2016/076222 A1 | 5/2016 |

OTHER PUBLICATIONS

Office Action dated Sep. 25, 2019, by the Chinese Patent Office in Chinese Patent Application No. 201780006828.X and English translation of the Office Action. (16 pages).
International Search Report (Form PCT/ISA/210) dated Mar. 21, 2017, by the Japan Patent Office as the International Searching Authority for International Application No. PCT/JP2017/000403. (5 pages).
Written Opinion (Form PCT/ISA/237) dated Mar. 21, 2017, by the Japan Patent Office as the International Searching Authority for International Application No. PCT/JP2017/000403. (11 pages).
International Search Report (PCT/ISA/210) dated Jun. 6, 2017, by the Japan Patent Office as the International Searching Authority for International Application No. PCT/JP2017/009795.
Written Opinion (PCT/ISA/237) dated Jun. 6, 2017, by the Japan Patent Office as the International Searching Authority for International Application No. PCT/JP2017/009795.
Office Action dated May 19, 2021, by the German Patent Office in corresponding German Patent Application No. 112017003113.3 and English translation of the Office Action. (13 pages).

* cited by examiner

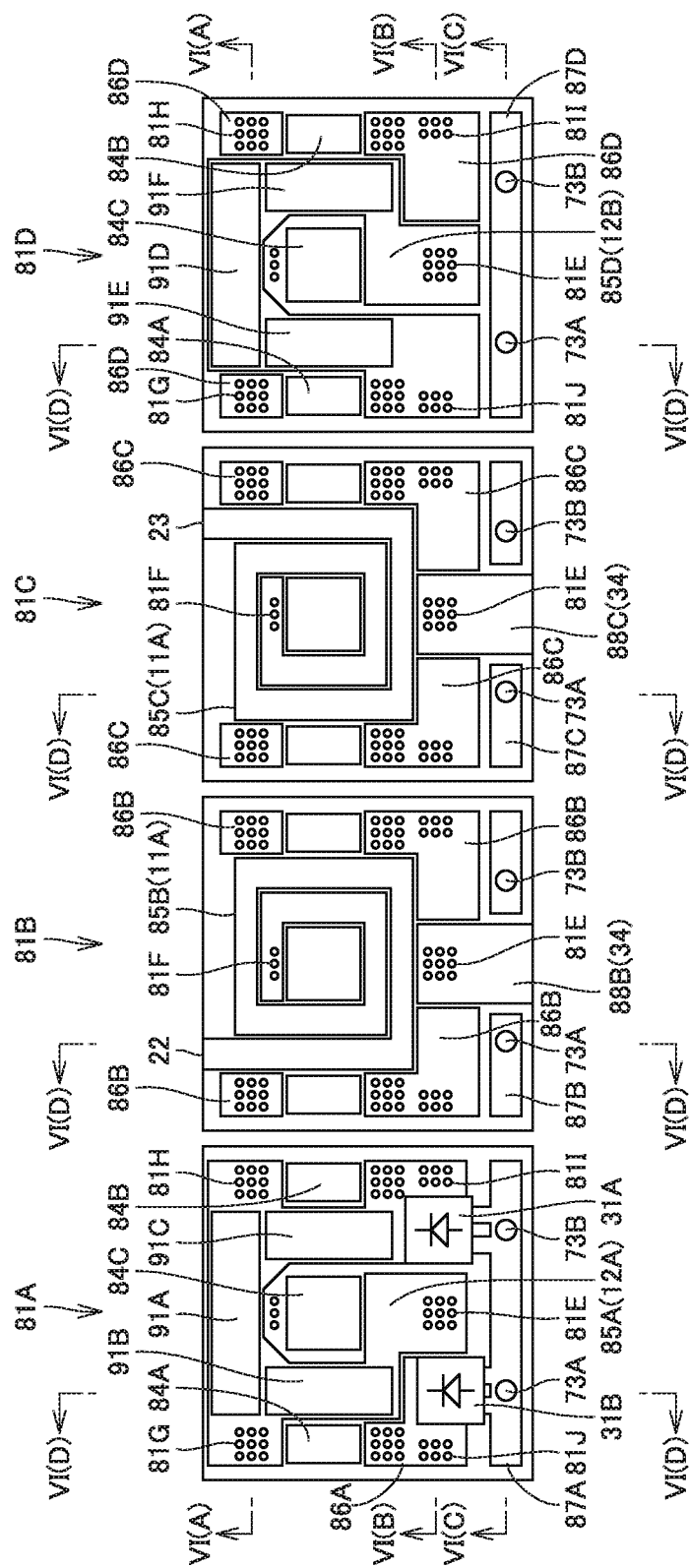

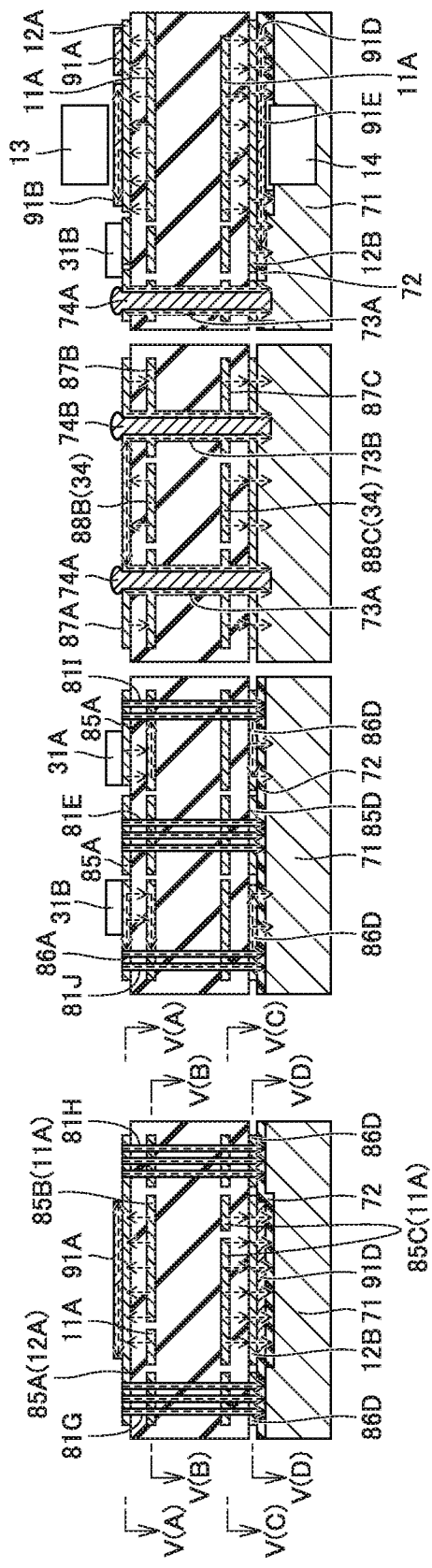

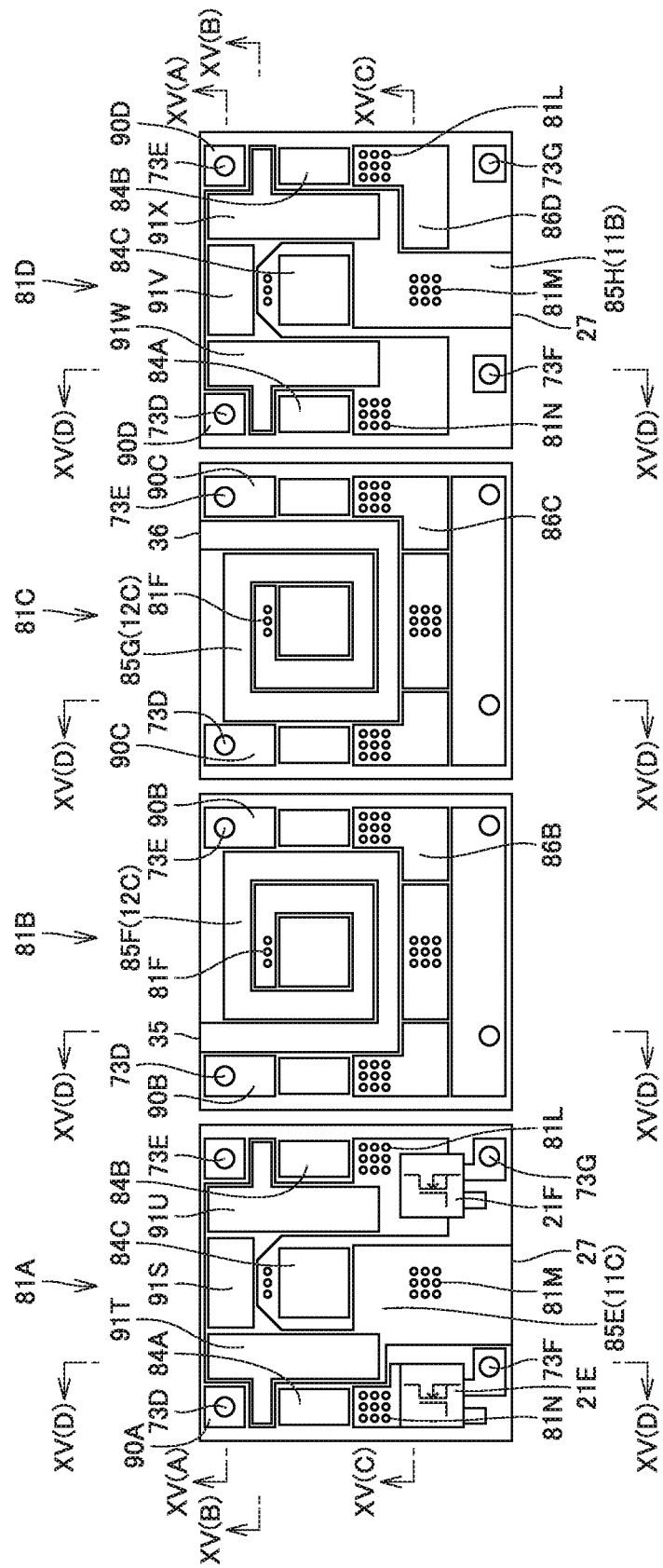

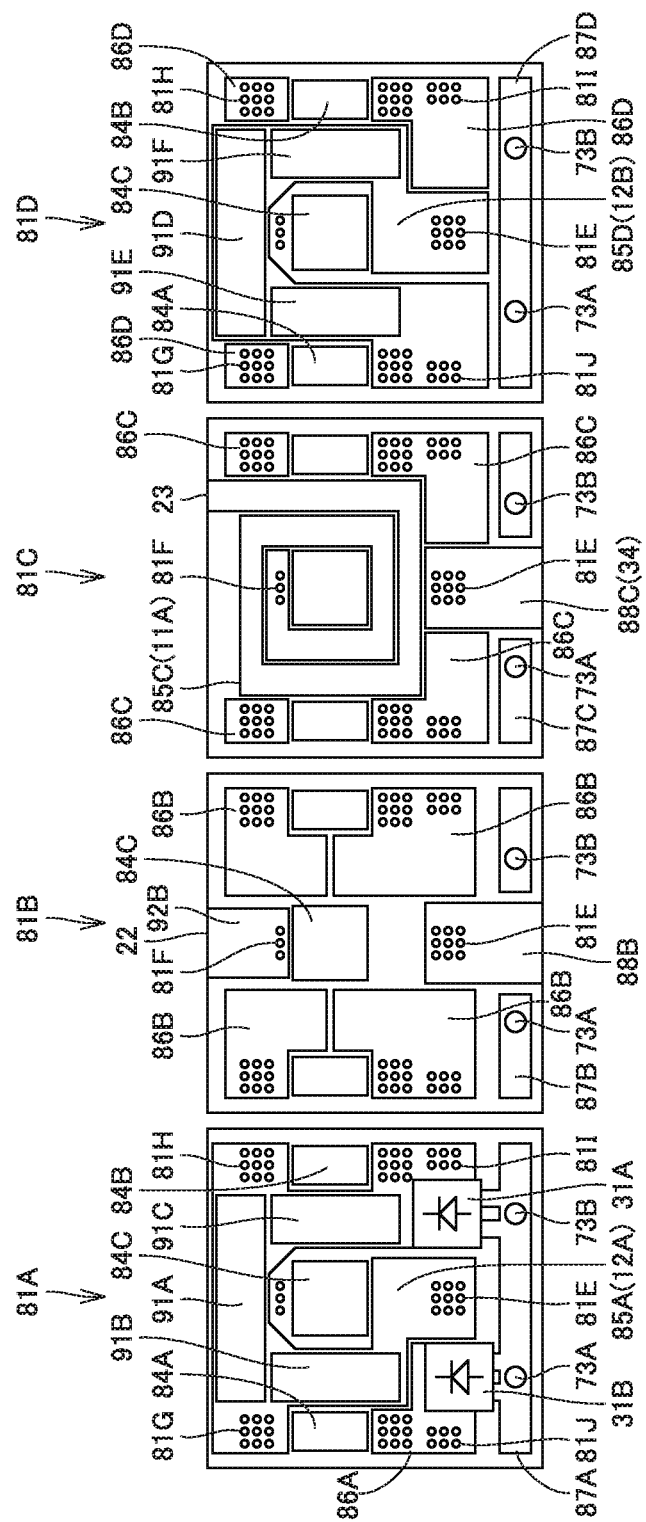

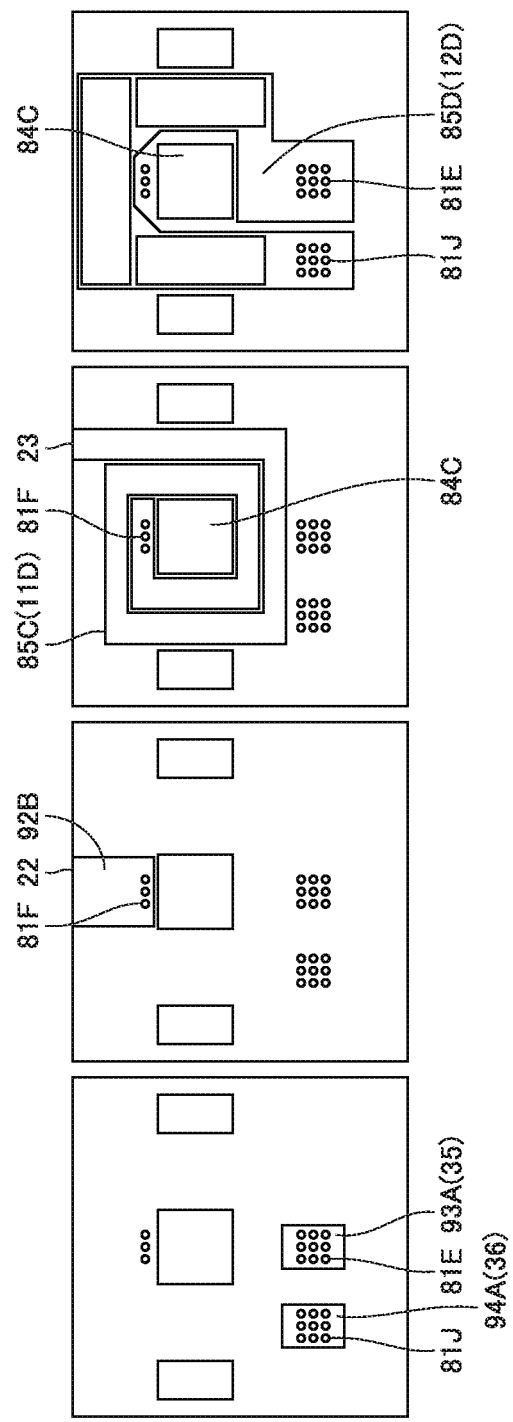

ISOLATED CONVERTER

TECHNICAL FIELD

The present invention relates to an isolated converter and more specifically to an isolated converter including a transformer having coils formed with patterns formed on a multilayer substrate.

BACKGROUND ART

Isolated converters having primary-side and secondary-side coils formed on multilayer substrates have been known. In a conventional isolated converter, a primary-side coil and a secondary-side coil are formed with winding patterns separated from each other by an isolation distance on a front layer and an internal layer of a multilayer substrate.

Magnetic devices including choke coils formed on multilayer substrates also have been known. Japanese Patent Laying-Open No. 2014-199908 (PTL 1) discloses a magnetic device in which coils are formed with a plurality of coil patterns formed on an exterior layer and an internal layer of a multilayer substrate. In the magnetic device described in PTL 1 above, a heat dissipation pin electrically continuous with a coil pattern on the internal layer and a heat dissipation pin electrically insulated are formed, and the heat dissipation pins are connected to a heat sink on the exterior layer.

CITATION LIST

Patent Literature

PTL 1: Japanese Patent Laying-Open No. 2014-199908

SUMMARY OF INVENTION

Technical Problem

However, in the conventional isolated converter, a predetermined isolation distance need to be provided even between a heat conduction via connecting the primary-side coil with the cooler and a heat conduction via connecting the secondary-side coil with the cooler. In order to provide an isolation distance in this manner, for example, a heat conduction via may be formed at a sufficient distance from the coil pattern. However, in this case, the size of the isolated converter is increased. Moreover, the distance between the heat generation portion and the heat conduction via is long, which makes it difficult to sufficiently dissipate the heat from the heat generation portion.

Moreover, for example, if the size (for example, width) of the coil pattern is reduced in order to provide an isolation distance between the coil pattern and the heat conduction via, the amount of heat generation in the coil pattern is increased. In the magnetic device described in PTL 1 above, heat is unable to be dissipated sufficiently through the heat dissipation pin when the distance between the heat generation portion and the heat dissipation pin is long.

The present invention is made in order to solve the problem as described above. The main object of the present invention is to provide an isolated converter reduced in size compared with a conventional isolated converter and having a high heat dissipation characteristic.

Solution to Problem

An isolated converter according to the present invention includes a substrate having a first surface and a second surface positioned on a side opposite to the first surface and having a first through hole extending from the first surface to the second surface, and a magnetic core partially passing through the first through hole. The substrate includes a first conductor pattern formed at a position overlapping the magnetic core on the second surface when viewed from an orthogonal direction to the first surface, a second conductor pattern formed between the first surface and the second surface at a position overlapping the magnetic core and the first conductor pattern when viewed from the orthogonal direction to the first surface, at least one thermal conductive member formed on the first conductor pattern and having a portion disposed between the substrate and the magnetic core, and an insulative heat-transferring member electrically insulating the first conductor pattern from the second conductor pattern.

Advantageous Effects of Invention

The present invention provides an isolated converter reduced in size compared with a conventional isolated converter and having a high heat dissipation characteristic.

BRIEF DESCRIPTION OF DRAWINGS

FIGS. 5(A)-(D) are plan views of the layers of the multilayer substrate shown in FIG. 3 when viewed from the first surface side, in which (A) is a plan view of a first layer, (B) is a plan view of a second layer, (C) is a plan view of a third layer, and (D) is a plan view of a fourth layer.

FIG. 6(A) is a cross-sectional view taken along line VI(A)-VI(A) shown in FIG. 5(A), FIG. 6(B) is a cross-sectional view taken along line VI(B)-VI(B) shown in FIG. 5(B), FIG. 6(C) is a cross-sectional view taken along line VI(C)-VI(C) shown in FIG. 5(C), and FIG. 6(D) is a cross-sectional view taken along line VI(D)-VI(D) shown in FIG. 5(D).

FIG. 8(B) is a cross-sectional view taken along line VIII(B)-VIII(B) in FIG. 8(A).

FIGS. 14(A)-(D) are plan views of the layers of the multilayer substrate when viewed from the first surface side in the isolated converter according to the third embodiment, in which (A) is a plan view of a first layer, (B) is a plan view of a second layer, (C) is a plan view of a third layer, and (D) is a plan view of a fourth layer.

FIGS. 16(A)-(D) are plan views of the layers of the multilayer substrate when viewed from the first surface side in an isolated converter according to a fourth embodiment, in which (A) is a plan view of a first layer, (B) is a plan view of a second layer, (C) is a plan view of a third layer, and (D) is a plan view of a fourth layer.

FIGS. 18(A)-(D) are plan views of the layers of the multilayer substrate when viewed from the first surface side in the isolated converter according to the fifth embodiment, in which (A) is a plan view of a first layer, (B) is a plan view of a second layer, (C) is a plan view of a third layer, and (D) is a plan view of a fourth layer.

DESCRIPTION OF EMBODIMENTS

Figure 1:
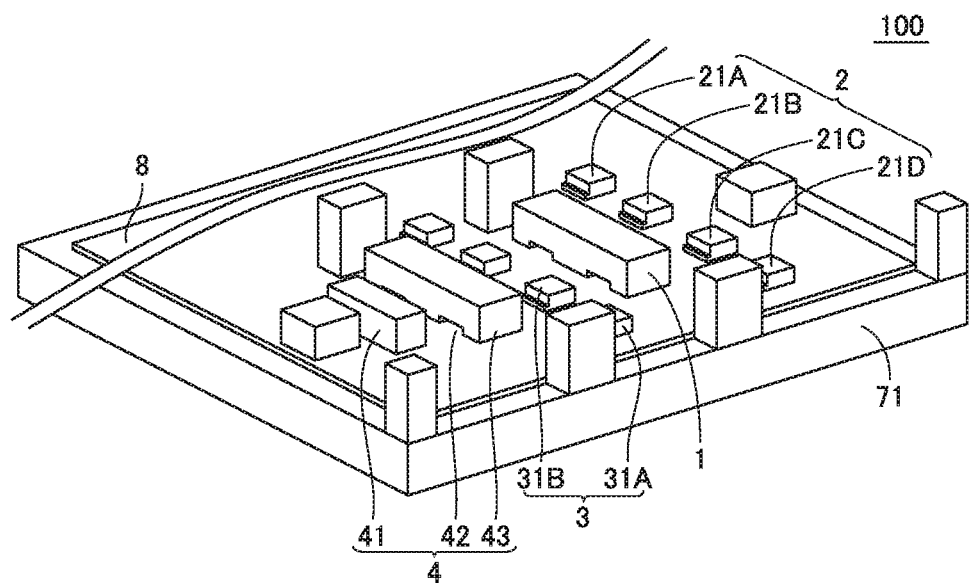
FIG. 1 is a perspective view showing an isolated converter according to a first embodiment.

Embodiments of the present invention will be described below with reference to the figures. In the figures described below, the same or corresponding parts are denoted by the same reference numerals and a description thereof will not be repeated.

First Embodiment

<Configuration of Isolated Converter>

Figure 2:
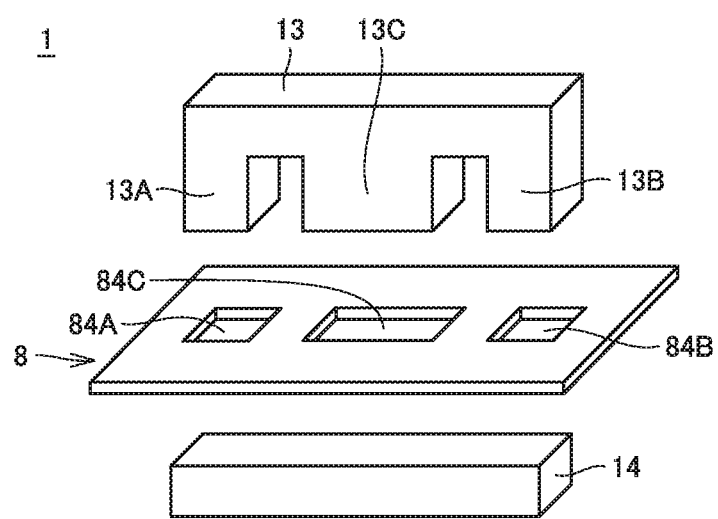
FIG. 2 is an exploded perspective view showing a transformer part of the isolated converter according to the first embodiment.
Figure 3:
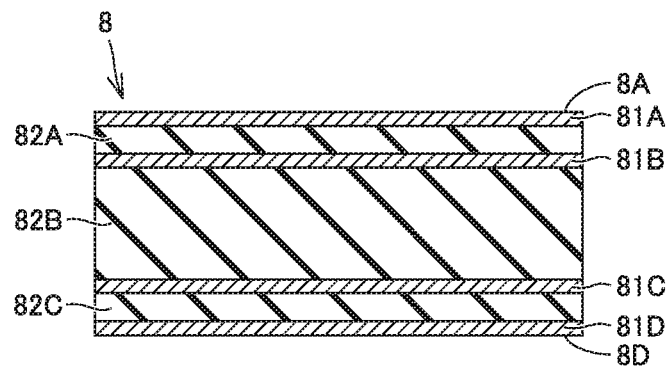
FIG. 3 is a cross-sectional view of a multilayer substrate forming the transformer part of the isolated converter according to the first embodiment.

Referring to FIG. 1 to FIG. 3, a configuration of an isolated converter 100 according to a first embodiment will be described. Isolated converter 100 includes a transformer 1, a primary-side drive circuit 2, a rectifying circuit 3, and a smoothing circuit 4. Transformer 1, primary-side drive circuit 2, rectifying circuit 3, and smoothing circuit 4 are mounted on a multilayer substrate 8.

Transformer 1 includes a primary-side coil 11A (see FIG. 4) and secondary-side coils 12A, 12B configured with conductor patterns formed on multilayer substrate 8, and magnetic cores 13, 14 (see FIG. 2). The detailed configuration of transformer 1 will be described later. Primary-side drive circuit 2 includes a plurality of switching elements 21A, 21B, 21C, 21D mounted on multilayer substrate 8. Rectifying circuit 3 includes a plurality of rectifying elements 31A, 31B (see FIG. 4) mounted on multilayer substrate 8. Smoothing circuit 4 includes a smoothing capacitor 41, a smoothing coil 42 configured with a conductor pattern formed on multilayer substrate 8, and a magnetic core 43. Multilayer substrate 8 has a first surface 8A and a second surface 8D positioned on the opposite side to first surface 8A. Second surface 8D of multilayer substrate 8 is connected and fixed to a casing 71 (cooler).

Figure 4:
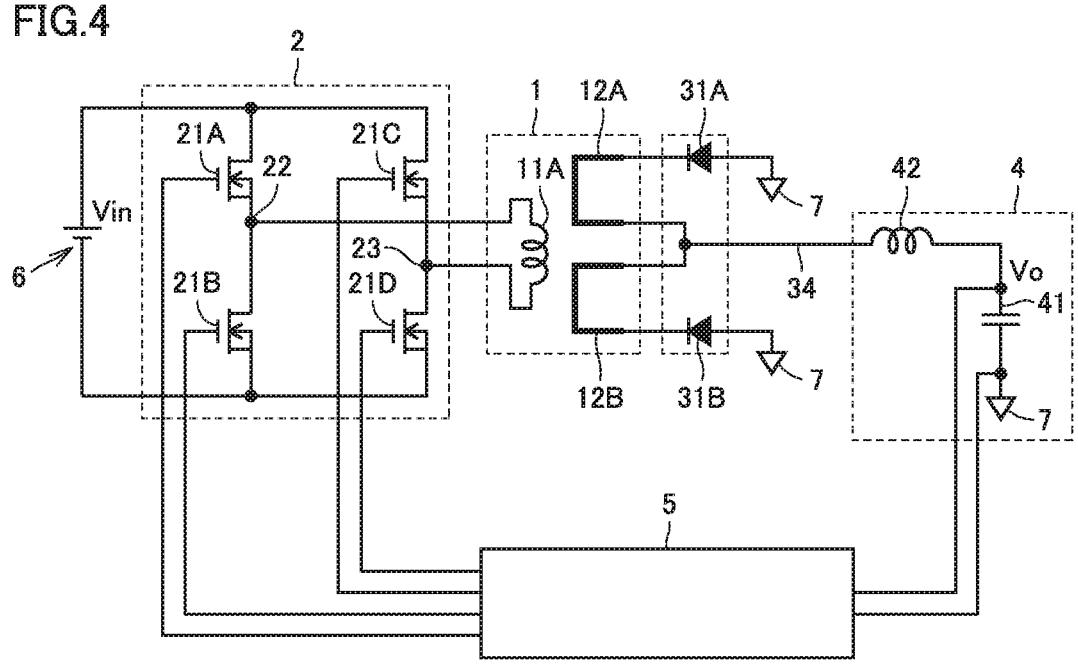
FIG. 4 is a circuit diagram of the isolated converter according to the first embodiment.

As shown in FIG. 4, primary-side drive circuit 2 is configured with a switching element 21A and a switching element 21B connected in series and a switching element 21C and a switching element 21D connected in series. Primary-side coil 11A of transformer 1 is connected between a contact point 22 between switching element 21A and switching element 21B and a contact point 23 between switching element 21C and switching element 21D. Switching element 21A and switching elements 21B, 21C, 21D are, for example, MOSFETs. The drain terminals of switching elements 21A, 21C are connected to the positive side of a direct-current (DC) power supply 6. The source terminals of switching elements 21B, 21D are connected to the negative side of DC power supply 6.

In rectifying circuit 3, the cathode terminals of rectifying elements 31A, 31B are connected to secondary-side coils 12A, 12B of transformer 1. The anode terminals of rectifying elements 31A, 31B are connected to a reference potential 7 on the secondary side of isolated converter 100. A contact point 34 between secondary-side coils 12A and 12B is connected to smoothing coil 42 in smoothing circuit 4. Smoothing coil 42 and smoothing capacitor 41 are connected in series. Voltage Vo of smoothing capacitor 41 in smoothing circuit 4 serves as output voltage (secondary-side voltage) Vo of isolated converter 100.

Primary-side drive circuit 2 and smoothing circuit 4 are connected to a control circuit 5. Control circuit 5 controls the on/off operation of switching elements 21A, 21B, 21C, 21D in primary-side drive circuit 2 such that voltage Vo of smoothing capacitor 41 has a predetermined value.

<Configuration of Transformer>

Referring now to FIG. 2 to FIG. 6, a specific configuration of transformer 1 will be described. Magnetic cores 13, 14 of transformer 1 are, for example, an E-shaped core 13 having an E-shaped side surface and an I-shaped core 14 having an I-shaped side surface. E-shaped core 13 has outside legs 13A, 13B and an inside leg 13C. In a region having transformer 1 on multilayer substrate 8, through holes 84A, 84B, 84C are formed to extend from first surface 8A to second surface 8D. Outside legs 13A, 13B and inside leg 13C of E-shaped core 13 are inserted in through holes 84A, 84B, 84C, respectively. A coupling portion coupling outside legs 13A, 13B and inside leg 13C of E-shaped core 13 is disposed on, for example, first surface 8A of multilayer substrate 8. I-shaped core 14 is disposed on, for example, second surface 8D of multilayer substrate 8 and connected to outside legs 13A, 13B and inside leg 13C of E-shaped core 13. Thus, in magnetic cores 13, 14, a magnetic path passing through outside leg 13A and inside leg 13C and a magnetic path passing through outside leg 13B and inside leg 13C are formed.

As shown in FIG. 3, multilayer substrate 8 is configured as, for example, a stack structure in which four conductor pattern layers 81A, 81B, 81C, 81D and three electric insulating layers 82A, 82B, 82C are alternately stacked in a direction orthogonal to first surface 8A (hereinafter simply referred to as orthogonal direction). Conductor pattern layer 81A is formed on first surface 8A. Conductor pattern layer 81D is formed on second surface 8D. Conductor pattern layer 81B is formed between first surface 8A and second surface 8D and is stacked with conductor pattern layer 81A with electric insulating layer 82A interposed therebetween. Conductor pattern layer 81C is formed between first surface 8A and second surface 8D and is stacked with conductor pattern layer 81B with electric insulating layer 82C interposed. Conductor pattern layer 81B is stacked with conductor pattern layer 81C with electric insulating layer 82B interposed. In other words, conductor pattern layer 81A, electric insulating layer 82A, conductor pattern layer 81B, electric insulating layer 82B, conductor pattern layer 81C, electric insulating layer 82C, and conductor pattern layer 81D are stacked in this order.

The material forming conductor pattern layers 81A, 81B, 81C, 81D is any material that has electric conductivity, and examples include copper (Cu). The material forming electric insulating layers 82A, 82B, 82C is any material that has electrical insulating properties and is preferably a material having a relatively high thermal conductivity. That is, electric insulating layers 82A to 82C are configured as members having electrical insulating properties and having a high thermal conductivity (insulative heat-transferring member).

Conductor pattern layers 81A to 81D each have a thickness of, for example, 35 μm to 105 μm. The thickness of electric insulating layer 82A, 82C in the orthogonal direction is thinner than the thickness of electric insulating layer 82B and, for example, 0.1 mm to 0.3 mm. The thickness of electric insulating layer 82B is, for example, 0.6 mm to 1.0 mm. Electric insulating layer 82A provides electrical insulation and thermal connection between conductor pattern layer 81A and conductor pattern layer 81B. Electric insulating layer 82B provides electrical insulation and thermal connection between conductor pattern layer 81B and conductor pattern layer 81C. Electric insulating layer 82C provides electrical insulation and thermal connection between conductor pattern layer 81C and conductor pattern layer 81D.

As shown in FIG. 5, each of conductor pattern layers 81A, 81B, 81C, 81D has a conductor pattern forming primary-side coil 11A or secondary-side coils 12A, 12B and another conductor pattern formed on the periphery of the conductor pattern. The conductor patterns of conductor pattern layers 81A, 81B, 81C, 81D are electrically connected through vias 81E to 81J to form an electrical circuit shown in FIG. 2 on multilayer substrate 8 (detail will be described later).

As shown in FIG. 5(A), conductor pattern layer 81A has a third conductor pattern 85A forming secondary-side coil 12A and conductor patterns 86A, 87A formed on the periphery of third conductor pattern 85A. Third conductor pattern 85A is formed in the form of winding so as to surround through hole 84C. Third conductor pattern 85A has a portion formed between through hole 84C and through hole 84A and a portion formed between through hole 84C and through hole 84B. Conductor patterns 86A, 87A are formed at a distance from third conductor pattern 85A.

As shown in FIG. 5(B), conductor pattern layer 81B has a fourth conductor pattern 85B forming primary-side coil 11A, and a conductor pattern 86B (sixth conductor pattern) and a conductor pattern 87B formed on the periphery of fourth conductor pattern 85B. Fourth conductor pattern 85B is formed in the form of winding so as to surround through hole 84C. Conductor patterns 86B, 87B, 88B are formed at an isolation distance from fourth conductor pattern 85B.

As shown in FIG. 5(C), conductor pattern layer 81C has a second conductor pattern 85C forming primary-side coil 11A, and a conductor pattern 86C (sixth conductor pattern) and a conductor pattern 87C formed on the periphery of second conductor pattern 85C. Second conductor pattern 85C is formed in the form of winding so as to surround through hole 84C. Conductor patterns 86C, 87C, 88C are formed at an isolation distance from second conductor pattern 85C.

As shown in FIG. 5(D), conductor pattern layer 81D has a first conductor pattern 85D forming secondary-side coil 12B, and a conductor pattern 86D (fifth conductor pattern) and a conductor pattern 87D formed on the periphery of first conductor pattern 85D. First conductor pattern 85D is formed in the form of winding so as to surround through hole 84C. First conductor pattern 85D has a portion formed between through hole 84C and through hole 84A and a portion formed between through hole 84C and through hole 84B. Conductor patterns 86D, 87D are formed at a distance from first conductor pattern 85D.

As shown in FIGS. 5(A) to 5(D), fourth conductor pattern 85B is formed such that, when viewed from the orthogonal direction (when first surface 8A is viewed two-dimensionally), a large part (for example, an area ratio of 80% or more, preferably 90% or more) of the position overlapping the coupling portion of the E-shaped core overlaps conductor pattern layer 81A, for example, third conductor pattern 85A. Second conductor pattern 85C is formed such that, when viewed from the orthogonal direction to first surface 8A (when first surface 8A is viewed two-dimensionally), a large part (for example, an area ratio of 80% or more, preferably 90% or more) of the position overlapping the coupling portion of the E-shaped core overlaps conductor pattern layer 81D, for example, first conductor pattern 85D.

As shown in FIG. 5(A), thermal conductive members 91A, 91B, 91C are formed on third conductor pattern 85A. Each of thermal conductive members 91B, 91C is formed so as to be positioned between magnetic core 13 and multilayer substrate 8. Each of thermal conductive members 91A, 91B, 91C is formed so as to surround through hole 84C. It is preferable that each of thermal conductive members 91A, 91B, 91C has a portion formed on a region overlapping fourth conductor pattern 85B in third conductor pattern 85A when viewed from the orthogonal direction. Each of thermal conductive members 91A, 91B, 91C is formed, for example, along one side of through hole 84C. Thermal conductive member 91A and thermal conductive member 91B may be formed, for example, at a distance (gap portion) from each other. Thermal conductive member 91A and thermal conductive member 91C may be formed, for example, at a distance from each other.

As shown in FIG. 5(D), thermal conductive members 91D, 91E, 91F are formed on first conductor pattern 85D. Each of thermal conductive members 91E, 91F is formed so as to be positioned between magnetic core 14 and multilayer substrate 8. Each of thermal conductive members 91D to 91F is formed so as to surround through hole 84C. It is preferable that each of thermal conductive members 91D to 91F has a portion formed on a region overlapping second conductor pattern 85C in first conductor pattern 85D when viewed from the orthogonal direction. Each of thermal conductive members 91D to 91F is formed, for example, along one side of through hole 84C. Thermal conductive member 91D and thermal conductive member 91E may be formed, for example, at a distance from each other. Thermal conductive member 91D and thermal conductive member 91F are formed, for example, at a distance from each other. Thermal conductive members 91A to 91F may have any shape, for example, a rectangular two-dimensional shape. Three thermal conductive members 91A to 91C formed on third conductor pattern 85A and three thermal conductive members 91D to 91F formed on first conductor pattern 85D are formed, for example, in a C shape when viewed from the orthogonal direction.

As shown in FIGS. 5(A) and 5(D), thermal conductive member 91A formed on third conductor pattern 85A and thermal conductive member 91D formed on first conductor pattern 85D are formed so as to overlap each other, for example, when viewed from the orthogonal direction. Similarly, thermal conductive member 91B and thermal conductive member 91E as well as thermal conductive member 91C and thermal conductive member 91F are formed so as to overlap each other, for example, when viewed from the orthogonal direction. The gap portion between thermal conductive member 91A and thermal conductive member 91B is formed so as to overlap the gap portion between thermal conductive member 91D and thermal conductive member 91E, and the gap portion between thermal conductive member 91A and thermal conductive member 91C is formed so as to overlap the gap portion between thermal conductive member 91D and thermal conductive member 91F, for example, when viewed from the orthogonal direction.

The material forming thermal conductive members 91A to 91F may be any material having a relatively high thermal conductivity and, for example, includes a material having a thermal conductivity equal to or higher than the material forming conductor pattern layers 81A to 81D, for example, including Cu or Cu alloy. Thermal conductive members 91A to 91F have a thickness of, for example, 0.5 mm to 1.0 mm. Thermal conductive members 91A to 91F are bonded on third conductor pattern 85A and first conductor pattern 85D with a material having a high thermal conductivity, for example, such as solder. It is preferable that thermal conductive members 91A to 91F are bonded entirely with third conductor pattern 85A and first conductor pattern 85D disposed entirely below.

As shown in FIGS. 5(A) to 5(D) and FIGS. 6(A) and 6(B), multilayer substrate 8 has a plurality of vias 81E, 81G, 81H, 81I, 81J electrically connecting conductor pattern layers 81A, 81B, 81C, 81D. The material forming vias 81E to 81J may be any material having electrical conductivity and includes, for example, Cu. Vias 81E to 81J may be formed, for example, by plating through holes on electric insulating layers 82A to 82C with copper. Vias 81E to vias 81J are formed on conductor pattern layers 81A to 81D in a distributed manner in a direction along first surface 8A.

Via 81E is connected to one end of third conductor pattern 85A, conductor patterns 88B, 88C, and one end of first conductor pattern 85D. Via 81G is formed such that thermal conductive member 91B is positioned between the portion connected to via 81G and the portion connected to via 81E in third conductor pattern 85A. Via 81H is formed such that thermal conductive member 91A is positioned between the portion connected to via 81H and the portion connected to via 81G in third conductor pattern 85A. Via 81I is formed such that thermal conductive member 91C is positioned between the portion connected to via 81I and the portion connected to via 81H in third conductor pattern 85A. Furthermore, each of vias 81G, 81H, 81I is connected to conductor patterns 86B, 86C, 86D. Via 81J is connected to conductor pattern 86A. Via 81J is connected to the other end of first conductor pattern 85D.

Multilayer substrate 8 further includes a via 81F electrically connecting only between conductor pattern layer 81B and conductor pattern layer 81C. Via 81F may be formed in electric insulating layers 82A and 82C so as to extend from conductor pattern layer 81B to first surface 8A or extend from conductor pattern layer 81C to second surface 8D. In this case, via 81F is formed at an isolation distance from conductor pattern layer 81A and conductor pattern layer 81D and is formed so as not to be electrically connected thereto.

As shown in FIGS. 6(C) and 6(D), multilayer substrate 8 has fixing holes 73A, 73B for receiving fixtures 74A, 74B for fixing multilayer substrate 8 to casing 71. Fixing holes 73A, 73B are formed so as to extend from first surface 8A to second surface 8D and pass through conductor pattern layers 81A to 81D. On the inner circumferential surfaces of fixing holes 73A, 73B, a conductive film of a material having electrical conductivity, for example, a Cu film may be formed. The conductive film may be formed, for example, by plating.

Multilayer substrate 8 exhibiting the configuration as described above is connected and fixed to casing 71 on the second surface 8D side. Each of first conductor pattern 85D and fifth conductor pattern 86D formed on second surface 8D is connected to casing 71 with a heat dissipation sheet 72 interposed. Conductor pattern 87D formed on second surface 8D is directly connected to casing 71. The material forming heat dissipation sheet 72 is a material having electrical insulating properties and having a relatively high thermal conductivity (for example, a material having a thermal conductivity equal to or higher than 1.0 W/mK). As heat dissipation sheet 72, for example, a thermal interface silicone ultra soft pad TC-CAS-10 (thermal conductivity of 1.8 W/mK) manufactured by Shin-Etsu Chemical Co., Ltd. or a thermal conductive spacer FSL-J (thermal conductivity of 1.0 W/mK) manufactured by Denka Company Limited may be employed.

Referring now to FIG. 2, FIG. 5 and FIG. 6, an electric circuit, specifically, the circuits related to transformer 1 formed on multilayer substrate 8 will be described. Referring to FIG. 2 and FIGS. 5(B) and 5(C), one end of fourth conductor pattern 85B is connected to one end of second conductor pattern 85C through via 81F. The other end of fourth conductor pattern 85B is connected to contact point 22 of primary-side drive circuit 2. The other end of second conductor pattern 85C is connected to contact point 23 of primary-side drive circuit 2. Thus, fourth conductor pattern 85B and second conductor pattern 85C are connected in series with contact points 22, 23 to form primary-side coil 11A.

Referring to FIG. 2, FIGS. 5(A) and 5(D), and FIGS. 6(A) and 6(B), one end of third conductor pattern 85A is connected to the cathode terminal of rectifying element 31A. One end of first conductor pattern 85D is connected to the cathode terminal of rectifying element 31B through conductor pattern 86A and via 81J. The other end of third conductor pattern 85A and the other end of first conductor pattern 85D are connected through via 81E and are connected to conductor pattern 88B and conductor pattern 88C through via 81E. Conductor patterns 88B, 88C are connected to contact point 34 of smoothing circuit 4. Thus, third conductor pattern 85A and first conductor pattern 85D are connected in parallel with contact point 34 and form secondary-side coil 12A and secondary-side coil 12B. The anode terminals of rectifying elements 31A, 31B are connected to casing 71 serving as reference potential 7 through conductor pattern 87A, fixing holes 73A, 73B, and conductor pattern 87D.

In multilayer substrate 8, the primary-side circuit and the secondary-side circuit of transformer 1 are formed on conductor pattern layer 81B and conductor pattern layer 81C. Specifically, fourth conductor pattern 85B and second conductor pattern 85C are connected to primary-side drive circuit 2. Conductor patterns 86B, 87B, 88B and conductor patterns 86C, 87C, 88C are connected to the secondary-side circuit such as rectifying circuit 3 and smoothing circuit 4. On the other hand, only the secondary-side circuit of transformer 1 is formed on conductor pattern layer 81A and conductor pattern layer 81D, except via 81F. Specifically, third conductor pattern 85A, conductor pattern 86A, conductor pattern 87A, first conductor pattern 85D, fifth conductor pattern 86D, and conductor pattern 87D are connected to the secondary-side circuit such as rectifying circuit 3 and smoothing circuit 4. In multilayer substrate 8, the conductor pattern forming the primary-side circuit and the conductor pattern forming the secondary-side circuit are formed to be spaced apart by at least an isolation distance that can satisfy a dielectric voltage (for example, 2 kV/min) required for isolated converter 100. As for the isolation distance, the isolation distance in conductor pattern layers 81B, 81C embedded in electric insulating layers 82A to 82C is shorter than the isolation distance in conductor pattern layers 81A, 81D not embedded in an electric insulating layer.

Referring now to FIG. 5 and FIG. 6, heat dissipation paths formed in multilayer substrate 8, specifically heat dissipation paths for transformer 1 will be described. In FIGS. 6(A) to 6(D), some of the heat dissipation paths are illustrated by dotted lines and arrows.

Referring to FIG. 5(B), and FIGS. 6(A), 6(B) and 6(D), heat generated in fourth conductor pattern 85B is transferred onto fourth conductor pattern 85B and transferred from fourth conductor pattern 85B through electric insulating layer 82A to third conductor pattern 85A and thermal conductive members 91A to 91C formed at a position overlapping fourth conductor pattern 85B when viewed from the orthogonal direction. Heat transferred to third conductor pattern 85A and thermal conductive members 91A to 91C is transferred together with heat generated in third conductor pattern 85A from vias 81E, 81G to 81J to casing 71 through first conductor pattern 85D and conductor patterns 86D, 87D. Furthermore, heat transferred to third conductor pattern 85A and thermal conductive members 91A to 91C is transferred to conductor patterns 86B, 88B through electric insulating layer 82A and transferred from vias 81E, 81G to 81J to casing 71 through first conductor pattern 85D and conductor patterns 86D, 87D. The larger the area in which fourth conductor pattern 85B and third conductor pattern 85A overlap each other in the orthogonal direction, the more effectively the heat transfer is performed through electric insulating layer 82A.

Referring to FIG. 5(C), and FIGS. 6(A), 6(B) and 6(D), heat generated in second conductor pattern 85C is transferred onto second conductor pattern 85C and transferred from second conductor pattern 85C through electric insulating layer 82C to first conductor pattern 85D and thermal conductive members 91D to 91F formed at a position overlapping second conductor pattern 85C when viewed from the orthogonal direction. Heat transferred to first conductor pattern 85D and thermal conductive members 91D to 91F is transferred together with heat generated in first conductor pattern 85D to casing 71. The larger the area in which second conductor pattern 85C and first conductor pattern 85D overlap each other in the orthogonal direction, the more effectively the heat transfer is performed through electric insulating layer 82C.

<Operation Effects>

Isolated converter 100 has first surface 8A and second surface 8D positioned on the opposite side to first surface 8A and includes multilayer substrate 8 having first through hole 84C extending from first surface 8A to second surface 8D and magnetic core 13 partially passing through first through hole 84C. Multilayer substrate 8 includes third conductor pattern 85A formed on first surface 8A in the form of winding on the periphery of first through hole 84C, first conductor pattern 85D formed on second surface 8D in the form of winding on the periphery of first through hole 84C, fourth conductor pattern 85B formed between first surface 8A and second surface 8D in the form of winding on the periphery of first through hole 84C and formed at a position overlapping third conductor pattern 85A when viewed from a direction orthogonal to first surface 8A, at least one thermal conductive members 91A to 91F formed on at least one of third conductor pattern 85A and first conductor pattern 85D and having a portion disposed between multilayer substrate 8 and magnetic core 13, and electric insulating layers 82A, 82C (insulative heat-transferring members) electrically insulating third conductor pattern 85A and first conductor pattern 85D from fourth conductor pattern 85B. Third conductor pattern 85A and first conductor pattern 85D are electrically connected with each other.

Isolated converter 100 in this manner includes electric insulating layers 82A, 82C electrically insulating third conductor pattern 85A and first conductor pattern 85D from fourth conductor pattern 85B, so that fourth conductor pattern 85B can be configured as a primary-side coil and third conductor pattern 85A and first conductor pattern 85D can be configured as secondary-side coils. Then, fourth conductor pattern 85B is formed at a position overlapping third conductor pattern 85A, so that isolated converter 100 can be reduced in size compared with a conventional isolated converter in which the primary-side coil and the secondary-side coil are formed side by side on a first surface.

In isolated converter 100, since fourth conductor pattern 85B is positioned at a position overlapping third conductor pattern 85A, heat generated in fourth conductor pattern 85B is transferred to third conductor pattern 85A through electric insulating layer 82A. Furthermore, in isolated converter 100, since thermal conductive members 91A to 91C are formed on third conductor pattern 85A, heat generated in third conductor pattern 85A and heat transferred to third conductor pattern 85A can be transferred in a direction along first surface 8A. As a result, formation of a large temperature difference between third conductor pattern 85A and fourth conductor pattern 85B that are coil patterns can be suppressed. Therefore, isolated converter 100 can have high heat dissipation characteristic because of third conductor pattern 85A incorporated in a heat dissipation path. If a large temperature difference is formed on a coil pattern, it is necessary to form a via for heat transfer to serve as a heat dissipation path near the portion in the coil pattern where heat is likely to be relatively high. When the via for heat transfer is formed for the primary-side coil and the secondary-side coil formed to overlap in the orthogonal direction, it need to be formed at an isolation distance from at least one of the coils. In this case, it is difficult to reduce the size of the transformer because of the isolation distance. By contrast, isolated converter 100 has a high heat dissipation characteristic without forming a via for heat transfer near third conductor pattern 85A and fourth conductor pattern 85B and therefore can be further reduced in size compared with an isolated converter in which the primary-side coil and the secondary-side coil are formed so as to overlap each other and a via for heat transfer is formed near these coils.

In isolated converter 100 described above, multilayer substrate 8 further includes second conductor pattern 85C formed between first surface 8A and second surface 8D in the form of winding on the periphery of first through hole 84C and having a portion formed at a position overlapping at least one of third conductor pattern 85A and first conductor pattern 85D when viewed from the orthogonal direction. Third conductor pattern 85A, fourth conductor pattern 85B, second conductor pattern 85C, and first conductor pattern 85D are formed in order in the orthogonal direction. Fourth conductor pattern 85B and second conductor pattern 85C are electrically connected with each other. The distance between third conductor pattern 85A and fourth conductor pattern 85B in the orthogonal direction and the distance between first conductor pattern 85D and second conductor pattern 85C in the orthogonal direction are shorter than the distance between fourth conductor pattern 85B and second conductor pattern 85C in the orthogonal direction. That is, the thickness of electric insulating layers 82A, 82C is smaller than the thickness of electric insulating layer 82B.

In this manner, a plurality of coil patterns can be formed between first surface 8A and second surface 8D of multilayer substrate 8, so that, for example, the turns of primary-side coil 11A (or secondary-side coil) formed with fourth conductor pattern 85B and second conductor pattern 85C can be readily increased. Furthermore, since the thickness of electric insulating layers 82A, 82C is smaller than the thickness of electric insulating layer 82B, heat conduction from fourth conductor pattern 85B to third conductor pattern 85A through electric insulating layer 82A and heat conduction from second conductor pattern 85C to first conductor pattern 85D through electric insulating layer 82C can be efficiently performed.

When electric insulating layer 82B is formed to be thick, parasitic capacitor produced between fourth conductor pattern 85B in the form of winding formed on conductor pattern layer 81B and second conductor pattern 85C in the form of winding formed on conductor pattern layer 81C can be reduced. Therefore, in isolated converter 100, vibration during the on/off operation of a switching element, which may cause noise, can also be suppressed.

Isolated converter 100 described above further includes casing 71 connected to at least part of first conductor pattern 85D. By doing so, first conductor pattern 85D and third conductor pattern 85A electrically connected to first conductor pattern 85D can be incorporated into a heat dissipation path extending from fourth conductor pattern 85B to casing 71. Isolated converter 100 thus has a high heat dissipation characteristic because formation of a large temperature difference is suppressed in third conductor pattern 85A.

In isolated converter 100 described above, multilayer substrate 8 further includes fifth conductor pattern 86D formed in a region on second surface 8D that at least partially overlaps third conductor pattern 85A but does not overlap first conductor pattern 85D and fourth conductor pattern 85B when viewed from the orthogonal direction, and via 81G formed so as to extend from first surface 8A to second surface 8D and connecting third conductor pattern 85A with fifth conductor pattern 86D. At least part of fifth conductor pattern 86D is connected to casing 71.

In this manner, in addition to the heat dissipation path from third conductor pattern 85A to casing 71 through first conductor pattern 85D, a heat dissipation path from third conductor pattern 85A to casing 71 through fifth conductor pattern 86D can be formed. Therefore, isolated converter 100 having such a configuration has an even higher heat dissipation characteristic, compared with isolated converter 100 only having a heat dissipation path from third conductor pattern 85A to casing 71 through first conductor pattern 85D.

In isolated converter 100 described above, multilayer substrate 8 further includes sixth conductor patterns 86B, 86C formed between first surface 8A and second surface 8D and having a portion formed at a position overlapping at least one of third conductor pattern 85A and first conductor pattern 85D when viewed from the orthogonal direction. Fourth conductor pattern 85B is electrically insulated from sixth conductor patterns 86B, 86C. Sixth conductor patterns 86B, 86C are connected to casing 71.

In this manner, in addition to the heat dissipation path from third conductor pattern 85A to casing 71 through first conductor pattern 85D, a heat dissipation path from third conductor pattern 85A to casing 71 through sixth conductor patterns 86B, 86C can be additionally formed. Therefore, isolated converter 100 having such a configuration has an even higher heat dissipation characteristic, compared with isolated converter 100 only having a heat dissipation path from third conductor pattern 85A to casing 71 through first conductor pattern 85D.

<Modification>

In isolated converter 100, the thermal conductive member that may be formed on third conductor pattern 85A and first conductor pattern 85D of multilayer substrate 8 is not limited to the configuration shown in FIG. 5 and FIG. 6.

Figure 7A:
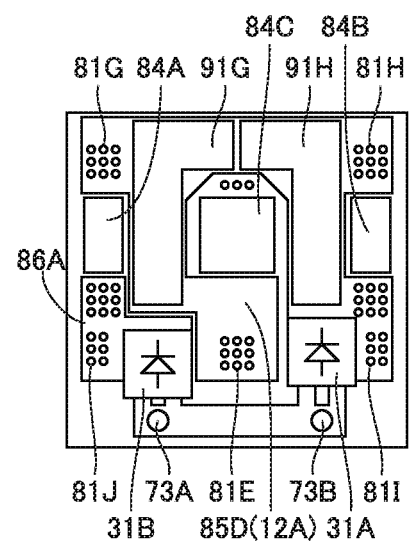
FIGS. 7(A) and 7(B) are plan views showing a modification of the thermal conductive member in the isolated converter according to the first embodiment.
Figure 7B:
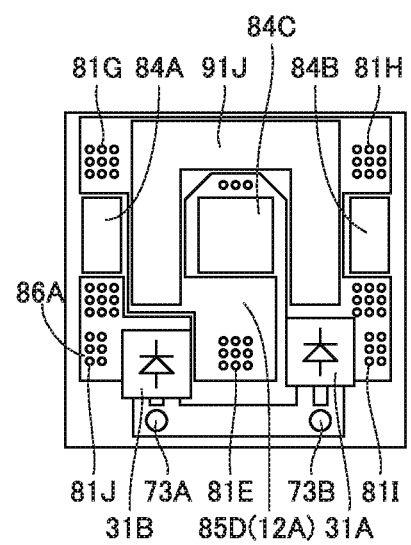

As shown in FIG. 7(A), two thermal conductive members 91G, 91H each having an L-shaped two-dimensional shape may be formed at a distance from each other on third conductor pattern 85A. As shown in FIG. 7(B), one thermal conductive member 91J having a C-shaped two-dimensional shape may be formed on third conductor pattern 85A.

Figure 8A:
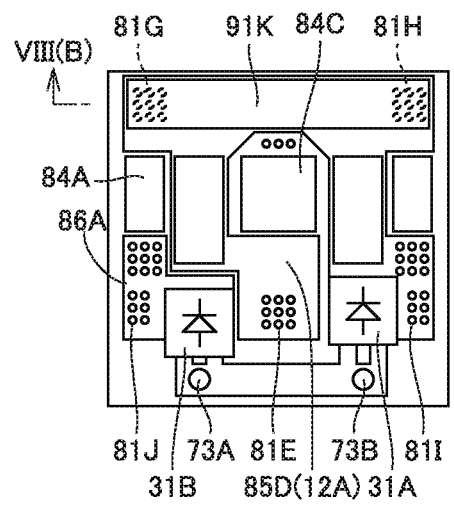
FIG. 8(A) is a plan view showing another modification of the thermal conductive member in the isolated converter according to the first embodiment.
Figure 8A:
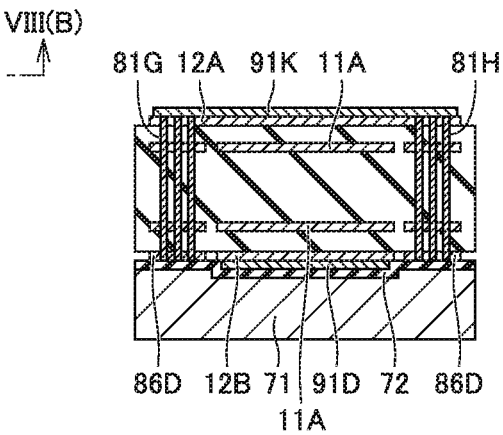

As shown in FIGS. 8(A) and 8(B), a thermal conductive member 91K may be formed so as to overlap vias 81G, 81H when viewed from the orthogonal direction and connected to vias 81G, 81H. Thermal conductive member 91K may be connected, for example, onto third conductor pattern 85A by reflow soldering. In this case, the amount of solder is slightly increased so that the inside of vias 81G, 81H can be filled with solder during heating for reflow. Thus, the solder fills in the copper plating formed on the interior walls of vias 81G, 81H and therefore the solder can serve as a heat transfer path in addition to copper plating. As a result, the heat dissipation characteristic through vias 81G, 81H can be increased. Although FIG. 7 and FIG. 8 show the thermal conductive members on third conductor pattern 85A, the thermal conductive members formed on first conductor pattern 85D may have a similar configuration.

Figure 9:
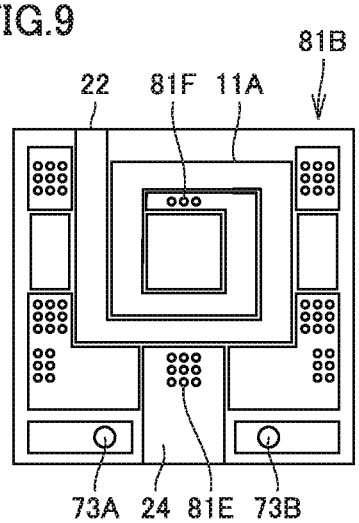
FIG. 9 is a plan view showing a modification of the fourth conductor pattern in the isolated converter according to the first embodiment.

As described above, via 81F connecting fourth conductor pattern 85B with second conductor pattern 85C may be formed to reach second surface 8D. In this case, as shown in FIG. 9, in fourth conductor pattern 85B and second conductor pattern 85C, the width of the portion connected to via 81F (the length in a direction vertical to the extending direction of fourth conductor pattern 85B and second conductor pattern 85C) may be relatively smaller than the other portion. Also in this manner, a relatively narrow portion is connected to via 81F and therefore has a high heat dissipation characteristic. A relatively wide portion is positioned at a distance from the narrow portion connected to via 81F but has a relatively large area, which enables effective heat dissipation to third conductor pattern 85A or first conductor pattern 85D through electric insulating layers 82A, 82C (see FIG. 3).

Second Embodiment

Figure 10:
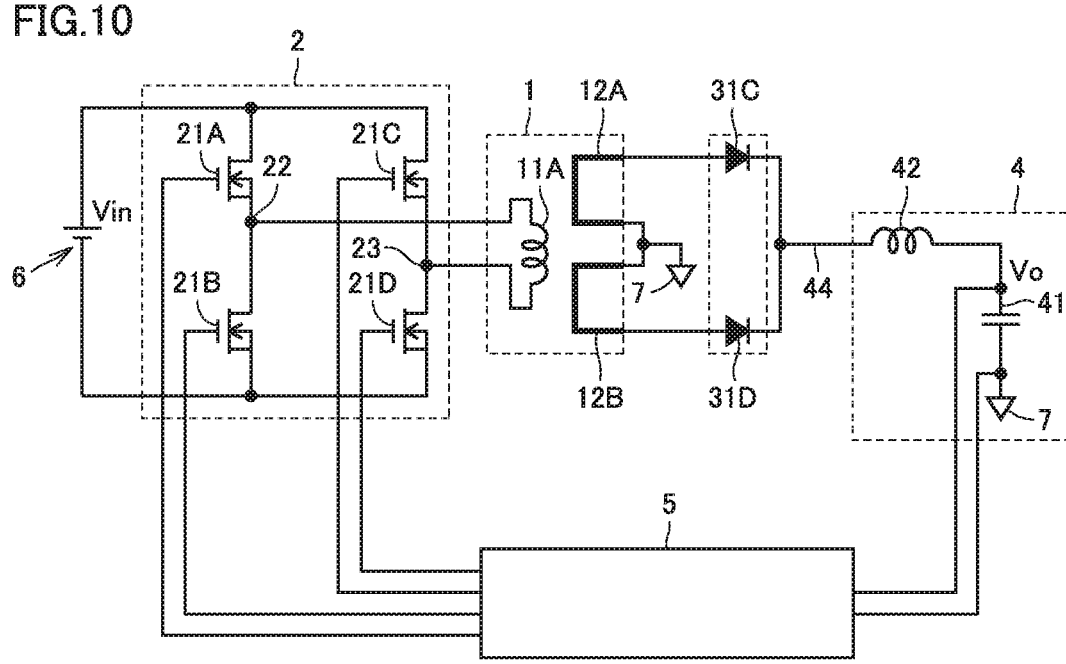
FIG. 10 is a circuit diagram of an isolated converter according to a second embodiment.
Figure 11:
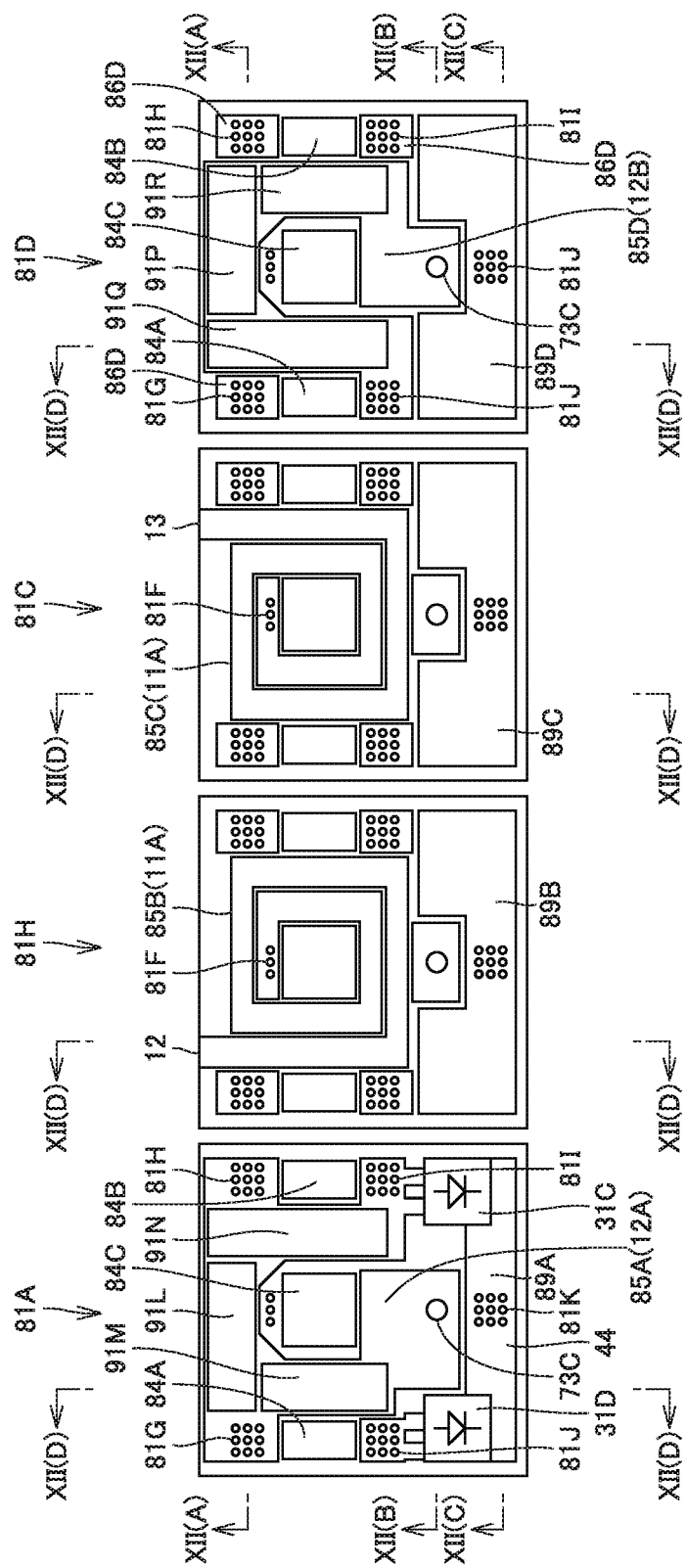
FIGS. 11(A)-(D) are plan views of the layers of the multilayer substrate in the isolated converter according to the second embodiment when viewed from the first surface side, in which (A) is a plan view of a first layer, (B) is a plan view of a second layer, (C) is a plan view of a third layer, and (D) is a plan view of a fourth layer.
Figure 12:
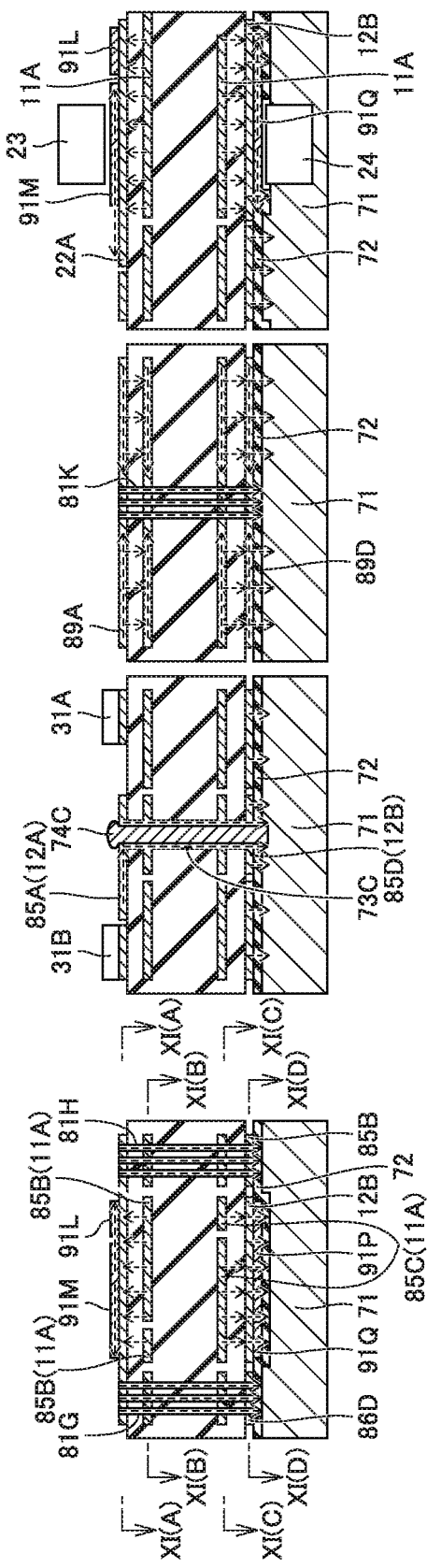
FIG. 12(A) is a cross-sectional view taken along line XII(A)-XII(A) shown in FIG. 11(A)
FIG. 12(B) is a cross-sectional view taken along line XII(B)-XII(B) shown in FIG. 11(B)
FIG. 12(C) is a cross-sectional view taken along line XII(C)-XII(C) shown in FIG. 11(C)
FIG. 12(D) is a cross-sectional view taken along line XII(D)-XII(D) shown in FIG. 11(D).

Referring now to FIG. 10 to FIG. 12, an isolated converter according to a second embodiment will be described. The isolated converter according to the second embodiment basically has a similar configuration as isolated converter 100 according to the first embodiment but differs in the secondary-side circuit configuration and the configuration of conductor patterns on multilayer substrate 8 forming the secondary-side circuit.

As shown in FIG. 10, the anode terminals of rectifying elements 31C, 31D forming rectifying circuit 8 are connected to secondary-side coils 12A, 12B of transformer 1. The cathode terminals of rectifying elements 31C, 31D are connected to smoothing circuit 4 (contact point 44).

As shown in FIG. 11, one end of third conductor pattern 85A is connected to the anode terminal of rectifying element 31C. The other end of third conductor pattern 85A has a fixing hole 73C. Fixing hole 73C has a configuration similar to fixing holes 73A, 73B and is formed to extend from first surface 8A to second surface 8D and pass through conductor pattern layers 81A to 81D. On the inner circumferential surface of fixing hole 73C, a conductive film of a material having electrical conductivity, for example, a Cu film may be formed. The conductive film may be formed, for example, by plating. The other end of third conductor pattern 85A is connected to first conductor pattern 85D and casing 71 through fixing hole 73C. The anode terminal of rectifying element 31D is connected to conductor pattern 86 formed at an isolation distance from third conductor pattern 85A.

The cathode terminals of rectifying elements 31C, 31D are connected to conductor pattern 89A formed at an isolation distance from third conductor pattern 85A on conductor pattern layer 81A. Conductor pattern 89A forms contact point 44.

Conductor pattern layers 81B, 81C, 81D have conductor patterns 89B, 89C, 89D, respectively, formed at an isolation distance from fourth conductor pattern 85B, second conductor pattern 85C, and first conductor pattern 85D. Conductor patterns 89A to 89D are connected through via 81K and further connected to casing 71 with heat dissipation sheet 72 interposed.

As shown in FIGS. 11(A) and 11(D), thermal conductive members 91L, 91M, 91N are formed on third conductor pattern 85A. Thermal conductive members 91P, 91Q, 91R are formed on first conductor pattern 85D. Thermal conductive members 91L to 91R basically have a similar configuration as thermal conductive members 91A to 91F but differ in that the gap portion between the thermal conductive members formed on third conductor pattern 85A is formed so as to overlap the thermal conductive member formed on first conductor pattern 85D.

The gap portion between thermal conductive member 91L and thermal conductive member 91M is formed so as to overlap thermal conductive member 91Q when viewed from the orthogonal direction. The gap portion between thermal conductive member 91L and thermal conductive member 91N is formed so as to overlap thermal conductive member 91P when viewed from the orthogonal direction. Similarly, when viewed from the orthogonal direction, the gap portion between thermal conductive member 91P and thermal conductive member 91Q is formed so as to overlap thermal conductive member 91L, and the gap portion between thermal conductive member 91P and thermal conductive member 91R is formed so as to overlap thermal conductive member 91N.

The heat dissipation paths in the isolated converter according to the second embodiment are basically similar to the heat dissipation paths in isolated converter 100 according to the first embodiment. That is, fourth conductor pattern 85B is formed at a position overlapping third conductor pattern 85A, so that heat generated in fourth conductor pattern 85B can be transferred to third conductor pattern 85A through electric insulating layer 82A. Furthermore, thermal conductive members 91L to 91N are formed on third conductor pattern 85A, so that heat generated in third conductor pattern 85A and heat transferred to third conductor pattern 85A can be transferred in a direction along first surface 8A.

The isolated converter according to the second embodiment therefore achieves the similar effect as in isolated converter 100 according to the first embodiment.

On the other hand, in the case where the gap portion between thermal conductive member 91L and thermal conductive member 91M is formed so as to overlap the gap portion between thermal conductive member 91L and thermal conductive member 91M when viewed from the orthogonal direction as in isolated converter 100 according to the first embodiment, warpage originating from the gap portion may occur in multilayer substrate 8. When warpage occurs in multilayer substrate 8, multilayer substrate 8 may be damaged depending on the amount of warpage. When warpage occurs in multilayer substrate 8, depending on the amount of warpage, the thickness of heat dissipation sheet 72 connecting multilayer substrate 8 with casing 71 need be increased by the amount of warpage of multilayer substrate 8, possibly resulting in reduction of the heat dissipation characteristic of isolated converter 100. Such a problem may be addressed, for example, by increasing the thickness of multilayer substrate 8 to increase its rigidity and suppressing increase of the amount of warpage of multilayer substrate 8.

By contrast, in the isolated converter according to the second embodiment, the gap portion between thermal conductive member 91L and thermal conductive member 91M is formed to overlap thermal conductive member 91Q when viewed from the orthogonal direction, so that the warpage of multilayer substrate 8 originating from the gap portion between thermal conductive member 91L and thermal conductive member 91M can be suppressed by thermal conductive member 91Q. As a result, the isolated converter according to the second embodiment has a high heat dissipation characteristic similar to isolated converter 100 according to the first embodiment while the thickness of multilayer substrate 8 can be reduced compared with isolated converter 100.

In the isolated converter according to the second embodiment, one end of each of third conductor pattern 85A and first conductor pattern 85D has the same potential as casing 71 and therefore is directly connected to casing 71 through fixing hole 73C. Therefore, in the isolated converter according to the second embodiment, the heat dissipation characteristic of the heat dissipation path through third conductor pattern 85A and first conductor pattern 85D is increased, compared with isolated converter 100 connected to casing 71 with heat dissipation sheet 72 interposed.

Third Embodiment

Figure 13:
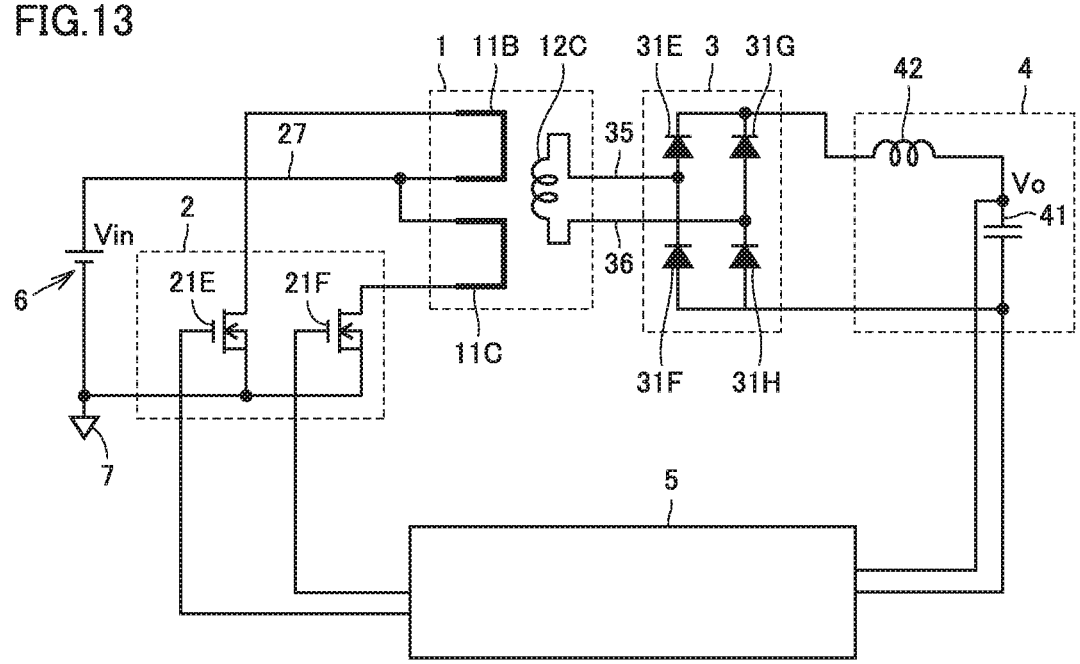
FIG. 13 is a circuit diagram of an isolated converter according to a third embodiment.
Figures 15A, 15B, 15C, 15D:
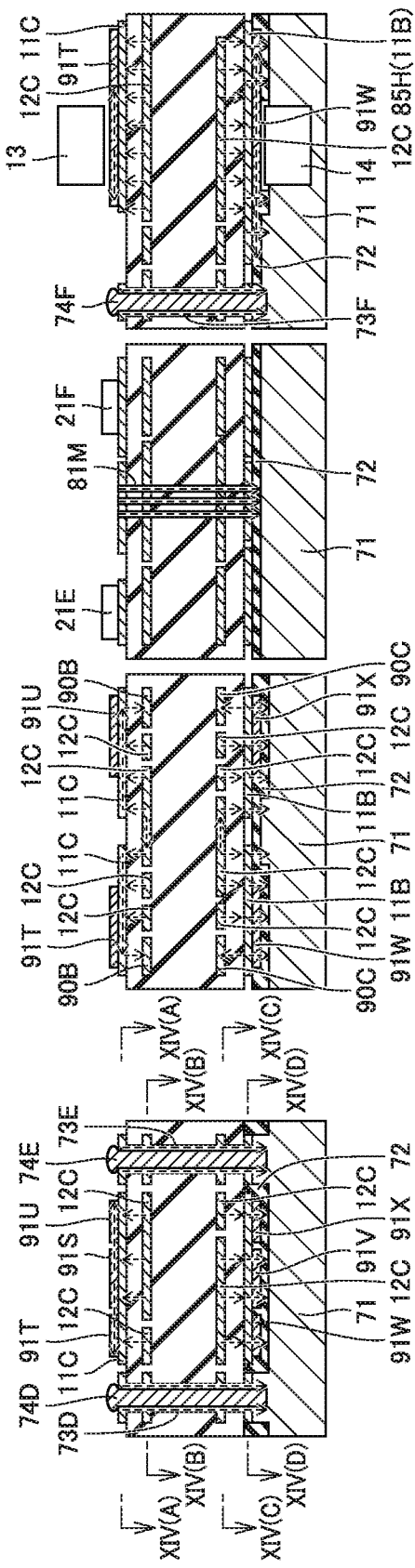
FIG. 15(A) is a cross-sectional view taken along line XV(A)-XV(A) shown in FIG. 14(A)
FIG. 15(B) is a cross-sectional view taken along line XV(B)-XV(B) shown in FIG. 14(B)
FIG. 15(C) is a cross-sectional view taken along line XV(C)-XV(C) shown in FIG. 14(C)
FIG. 15(D) is a cross-sectional view taken along line XV(D)-XV(D) shown in FIG. 14(D).

Referring now to FIG. 13 to FIG. 15, an isolated converter according to a third embodiment will be described. The isolated converter according to the third embodiment basically has a similar configuration as isolated converter 100 according to the first embodiment but differs in the primary-side and secondary-side circuit configuration and the configuration of conductor patterns forming circuits on multilayer substrate 8.

In the isolated converter according to the third embodiment, primary-side coils 11B, 11C of transformer 1 are configured with a third conductor pattern 85E formed on conductor pattern layer 81A and a first conductor pattern 85H formed on conductor pattern layer 81D. A secondary-side coil 12C of transformer 1 is configured with a fourth conductor pattern 85F formed on conductor pattern layer 81B and a second conductor pattern 85G formed on conductor pattern layer 81C. Third conductor pattern 85E, first conductor pattern 85H, fourth conductor pattern 85F, and second conductor pattern 85G are formed in the form of winding so as to surround fixing hole 74C.

As shown in FIG. 13, primary-side drive circuit 2 includes switching elements 21E, 21F. The drain terminals of switching elements 21E, 21F are connected to the corresponding ends of primary-side coils 11B, 11C of transformer 1. The source terminals of switching elements 21E, 21F are connected to the negative side (reference potential 7) of a DC power supply with an input voltage Vin. A contact point 27 between primary-side coils 11B and 11C of transformer 1 is connected to the positive side of the DC power supply.

As shown in FIG. 13, rectifying circuit 3 is configured with rectifying elements 31E, 31F connected in series and rectifying elements 31G, 31H connected in series. A secondary-side coil 12C of transformer 1 is connected between a contact point 35 between rectifying element 31E and rectifying element 31F and a contact point 36 between rectifying element 31G and rectifying element 31H. The cathode terminals of rectifying elements 31E, 31G are connected to smoothing coil 42. The anode terminals of rectifying elements 31E, 31G are connected to the negative side of smoothing capacitor 41.

As show in FIGS. 14(A) and 14(D), a conductor pattern layer 81A formed on first surface 8A of multilayer substrate 8 has a third conductor pattern 85E forming primary-side coil 11C and a conductor pattern 90A formed adjacent to the corner portion of third conductor pattern 85E at an isolation distance therefrom. Conductor pattern 90A is connected to casing 71 through fixing hole 73C. In other words, conductor pattern layer 81A has conductor pattern 90A connected to casing 71 and has third conductor pattern 85E formed at an isolation distance from conductor pattern 90A and formed so as to have an area as large as possible.

A conductor pattern layer 81D formed on second surface 8D of multilayer substrate 8 has a first conductor pattern 85H forming primary-side coil 11B. Conductor pattern layers 81B and 81C formed between first surface 8A and second surface 8D have a fourth conductor pattern 85F and a second conductor pattern 85G, respectively, to form secondary-side coil 11C.

Multilayer substrate 8 has fixing holes 73D, 73E, 73F, 73G. Fixing holes 73D to 73G basically have a similar configuration as fixing holes 73A, 73B. Fixing holes 73D to 73G are connected to the conductor patterns formed on conductor pattern layers 81A to 81D and are connected to casing 71. Fixing holes 73D, 73E are connected to conductor pattern 90A formed adjacent to the corner portion of third conductor pattern 85E at an isolation distance therefrom, conductor pattern 90B formed adjacent to fourth conductor pattern 85F at an isolation distance therefrom, conductor pattern 90C formed adjacent to second conductor pattern 85G at an isolation distance therefrom, and conductor pattern 90D formed adjacent to the corner portion of first conductor pattern 85H at an isolation distance therefrom. Conductor patterns 90B, 90C are formed between first surface 8A and second surface 8D and formed as sixth conductor patterns having a portion formed at a position overlapping at least one of third conductor pattern 85E and first conductor pattern 85H when viewed from the orthogonal direction.

One end of third conductor pattern 85E is connected to the drain terminal of switching element 21F and is connected to via 81L. The other end of third conductor pattern 85E is connected to via 81L and contact point 27. The source terminals of switching elements 21E, 21F are connected to casing 71 (reference potential 7), for example, through fixing holes 73F, 73G. One end of first conductor pattern 85H is connected to the drain terminal of switching element 21E through via 81N. The other end of first conductor pattern 85H is connected to via 81L and contact point 27. One end of fourth conductor pattern 85F is connected to contact point 35 of rectifying circuit 3. One end of second conductor pattern 85G is connected to contact point 36 of rectifying circuit 3. The other end of fourth conductor pattern 85F is connected to the other end of second conductor pattern 85G through via 81F.

As shown in FIGS. 14(A) and 14(D), thermal conductive members 91S, 91T, 91U are formed on third conductor pattern 85E. Thermal conductive members 91V, 91W, 91X are formed on first conductor pattern 85H. Thermal conductive members 91S to 91X basically have a similar configuration as thermal conductive members 91A to 91F. Thermal conductive members 91T, 91U, 91W, 91X are formed at a portion adjacent to conductor pattern 90A at an isolation distance therefrom in third conductor pattern 85E or first conductor pattern 85H. Thermal conductive members 91T, 91U, 91W, 91X have a convex two-dimensional shape.

A plurality of conductor patterns 86B formed at an isolation distance from fourth conductor pattern 85F are connected to fixing holes 73D, 73E and vias 81L, 81M, 81N. A plurality of conductor patterns 86C formed at an isolation distance from second conductor pattern 85G are connected to fixing holes 73D, 73E and vias 81L, 81M, 81N.

Conductor patterns 86B, 86C connected to fixing holes 73D, 73E are formed so as to overlap third conductor pattern 85E and first conductor pattern 85H when viewed from the orthogonal direction.

The heat dissipation paths in the isolated converter according to the third embodiment are basically similar to the heat dissipation paths in isolated converter 100 according to the first embodiment. Heat generated in fourth conductor pattern 85F is transferred to third conductor pattern 85E through electric insulating layer 82A and spread together with heat generated in third conductor pattern 85E over thermal conductive members 91S to 91U and then transferred to casing 71 through vias 81L to 81N and heat dissipation sheet 72. Heat generated in third conductor pattern 85E and heat transferred from fourth conductor pattern 85F to third conductor pattern 85E are spread over thermal conductive members 91S to 91U and then transferred to conductor pattern 86B through electric insulating layer 82A and transferred to casing 71 through fixing holes 73D, 73E and fixtures 74D, 74E (for example, screws). Similarly, heat generated in second conductor pattern 85G is transferred to first conductor pattern 85H through electric insulating layer 82C and spread together with heat generated in first conductor pattern 85H over thermal conductive members 91V to 91X, and then transferred to casing 71 through heat dissipation sheet 72. Heat generated in second conductor pattern 85G is transferred to conductor pattern 86D through electric insulating layer 82C and transferred to casing 71 through fixing holes 73C, 73D.

That is, since fourth conductor pattern 85F is formed at a position overlapping third conductor pattern 85E, heat generated in fourth conductor pattern 85F may be transferred to third conductor pattern 85E through electric insulating layer 82A. Furthermore, since thermal conductive members 91S to 91U are formed on third conductor pattern 85E, heat generated in third conductor pattern 85E and heat transferred to third conductor pattern 85E can be transferred in a direction along first surface 8A.

The isolated converter according to the third embodiment thus can achieve the similar effect as in isolated converter 100 according to the first embodiment.

In the isolated converter according to the third embodiment, conductor patterns 90A, 90B directly connected to casing 71 through fixing holes 73D, 73E are formed near third conductor pattern 85E, the corner portion of second conductor pattern 85G, or first conductor pattern 85H, fourth conductor pattern 85F, configured as a primary-side coil or a secondary-side coil.

Therefore, in the isolated converter according to the third embodiment, the heat dissipation characteristic of the heat dissipation path through third conductor pattern 85A and first conductor pattern 85D is increased, compared with isolated converter 100.

In the isolated converter according to the first to third embodiments, the turns of the primary-side coil or the secondary-side coil may be any number depending on the step-up ratio or the step-down ratio. For example, in isolated converter 100 according to the first embodiment shown in FIG. 4 and FIG. 5, given that the number of turns of primary-side coil 11A is six and the number of turns of secondary-side coils 12A, 12B is one, transformer 1 has a step-down ratio of 6:1.

Fourth Embodiment

In the isolated converter according to the first to third embodiments, primary-side coil 11A is formed with fourth conductor pattern 85B and second conductor pattern 85C. However, embodiments are not limited to this configuration. As shown in FIG. 16, primary-side coil 11A may be formed only with second conductor pattern 85C.

In conductor pattern layer 81B, a seventh conductor pattern 92B is formed in place of fourth conductor pattern 85B. When viewed from the orthogonal direction, seventh conductor pattern 92B is formed at a position overlapping third conductor pattern 85A, second conductor pattern 85C, and first conductor pattern 85D. One end of seventh conductor pattern 92B is connected through via 81F and to one end of second conductor pattern 85C. The other end of seventh conductor pattern 92B is connected to contact point 22 of primary-side drive circuit 2.

As shown in FIG. 16(b), sixth conductor patterns 86B may be formed widely in a region not having seventh conductor pattern 92B and conductor patterns 87B, 88B on conductor pattern layer 81B. The total area of sixth conductor patterns 86B in the conductor pattern 81B layer in the fourth embodiment may be larger than, for example, the total area of sixth conductor patterns 86B in the conductor pattern 81B layer in the first to third embodiments. A plurality of sixth conductor patterns 86B, seventh conductor pattern 92B, and conductor patterns 87B, 88B are formed at an isolation distance from each other. Since current is prevented from flowing between through hole 84C and through hole 84A and between through hole 84C and through hole 84B, the transformer can operate normally in the isolated converter.

Second conductor pattern 85C is formed as a primary-side coil, and third conductor pattern 85A and first conductor pattern 85D are formed as secondary-side coils. Therefore, the isolated converter according to the fourth embodiment can be reduced in size compared with a conventional isolated converter in which the primary-side coil and the secondary-side coil are formed side by side on a first surface.

Since seventh conductor pattern 92B is formed at a position overlapping third conductor pattern 85A, heat generated in seventh conductor pattern 92B may be transferred to third conductor pattern 85A through electric insulating layer 82A. The isolated converter according to the fourth embodiment thus can achieve the similar effect as in isolated converter 100 according to the first embodiment.

Fifth Embodiment

Figure 17:
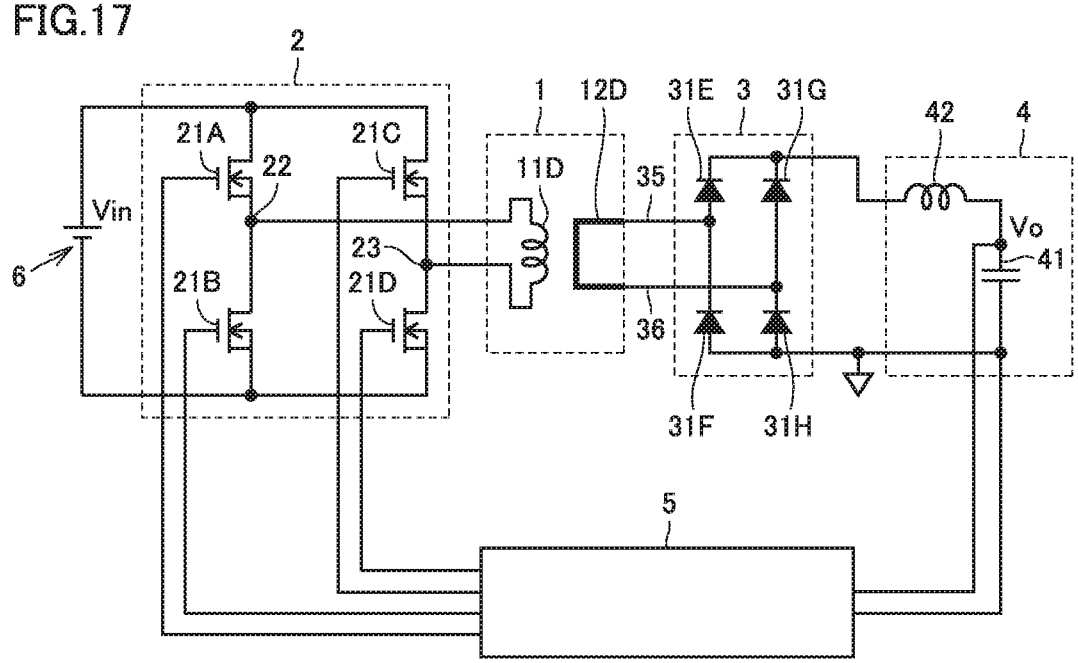
FIG. 17 is a circuit diagram of an isolated converter according to a fifth embodiment.

Referring now to FIG. 17 and FIG. 18, an isolated converter according to a fifth embodiment will be described. The isolated converter according to the fifth embodiment basically has a similar configuration as isolated converter 100 according to the first embodiment but differs in the primary-side and secondary-side circuit configuration and the configuration of the conductor patterns forming circuits on multilayer substrate 8.

In the isolated converter according to the fifth embodiment, a primary-side coil 11D of transformer 1 is configured with second conductor pattern 85C formed on conductor pattern layer 81C. A secondary-side coil 12D of transformer 1 is configured with first conductor pattern 85D formed on conductor pattern layer 81D. Each of first conductor pattern 85D and second conductor pattern 85C is formed in the form of winding so as to surround through hole 84C.

As shown in FIG. 17, primary-side drive circuit 2 is configured with a switching element 21A and a switching element 21B connected in series and a switching element 21C and a switching element 21D connected in series. A primary-side coil 11D of transformer 1 is connected between a contact point 22 between switching element 21A and switching element 21B and a contact point 23 between switching element 21C and switching element 21D. Switching element 21A and switching elements 21B, 21C, 21D are, for example, MOSFETs. The drain terminals of switching elements 21A, 21C are connected to the positive side of DC power supply 6. The source terminals of switching elements 21B, 21D are connected to the negative side of DC power supply 6.

Rectifying circuit 3 is configured with rectifying elements 31E and 31F connected in series and rectifying elements 31G and 31H connected in series. A secondary-side coil 12D of transformer 1 is connected between a contact point 35 between rectifying element 31E and rectifying element 31F and a contact point 36 between rectifying element 31G and rectifying element 31H. The cathode terminals of rectifying elements 31E, 31G are connected to smoothing coil 42. The anode terminals of rectifying elements 31E, 31G are connected to the negative side of smoothing capacitor 41.

As shown in FIG. 18(D), a conductor pattern layer 81D formed on second surface 8D of multilayer substrate 8 has a first conductor pattern 85D forming secondary-side coil 12D. As shown in FIG. 18(C), conductor pattern layer 81C formed between first surface 8A and second surface 8D has a second conductor pattern 85C forming primary-side coil 11D. As shown in FIG. 18(B), conductor pattern layer 81B formed between first surface 8A and second surface 8D has a seventh conductor pattern 92B. As shown in FIG. 18(A), conductor pattern layer 81A formed on first surface 8A has conductor patterns 93A, 94A.

One end of first conductor pattern 85D is connected to conductor pattern 93A on conductor pattern layer 81A through via 81E and is connected to contact point 35 of rectifying circuit 3 in conductor pattern 93A. The other end of first conductor pattern 85D is connected to conductor pattern 94A on conductor pattern layer 81A through via 81J and connected to contact point 36 of rectifying circuit 3 in conductor pattern 94A.

One end of second conductor pattern 85C is connected to seventh conductor pattern 92B on conductor pattern layer 81B through via 81F and connected to contact point 22 between switching element 21A and switching element 21B in seventh conductor pattern 92B. The other end of second conductor pattern 85C is connected to contact point 23 between switching element 21C and switching element 21D.

The heat dissipation paths for first conductor pattern 85D and second conductor pattern 85C are basically similar to those in the first to third embodiments and will not be further elaborated.

In FIG. 18, switching elements 21A to 21D, rectifying elements 31E to 31H, and/or control circuit 5 may be disposed in a portion in which the conductor patterns on conductor pattern layer 81A and conductor pattern layer 81B and via 81F are not shown. Therefore, in the fourth embodiment, the circuits and the components disposed on the periphery of the transformer in the first to third embodiments can be disposed to overlap first conductor pattern 85D and second conductor pattern 85C that constitute the transformer. As a result, the isolated converter according to the fourth embodiment can be reduced in size compared with the isolated converter according to the first to third embodiments.

It is noted that no conductor pattern is disposed for connecting through hole 84C with through hole 84A and connecting through hole 84 with through hole 84B. That is, current is prevented from flowing between through hole 84C and through hole 84A as well as between through hole 84 and through hole 84B. The transformer thus can operate normally in the isolated converter.

In the present description, "being formed so as to surround first through hole 84C" is not limited to being formed so as to surround the entire periphery (360 degrees) of through hole 84C but may refer to being disposed to the side of through hole 84C at least at the portion overlapping the coupling portion of the E-shaped core. As used herein "being formed so as to surround first through hole 84C" may refer to, for example, being formed so as to surround three-quarters of the periphery of through hole 84C. As described above, thermal conductive members 91A, 91B, 91C may be formed, for example, in a C shape, for example, along three sides of through hole 84C having a rectangular two-dimensional shape.

In the isolated converter according to the first to fifth embodiments, the magnetic core of transformer 1 may be configured as desired as long as a circulating magnetic path is formed. In the case of E-shaped core 13, the cross section vertical to the extending direction of inside leg 13C (direction orthogonal to first surface 8A of multilayer substrate 8) is preferably twice or more the cross section vertical to the orthogonal direction of the outside legs 13A, 13B. The magnetic core of transformer 1 may be configured with, for example, two E-shaped cores or may be an EER-shaped core having an E-shaped side surface and having a circular shape in cross section of the inside leg. The magnetic core of transformer 1 may be provided such that only one magnetic path can be formed. In this case, the magnetic core may be formed with a U-shaped core having a U shape on the side surface and an I-shaped core or may be formed with two U-shaped cores.

Although embodiments and examples of the present invention have been described above, the foregoing embodiments are susceptible to various modifications. It is initially intended that the configurations of the foregoing embodiments and examples are combined as appropriate. The scope of the present invention is not limited to the foregoing embodiments. The scope of the present invention is shown by the claims and it is intended that equivalents to the claims and all modifications within the scope of the claims are embraced.

REFERENCE SIGNS LIST

1 transformer, 2 primary-side drive circuit, 3 rectifying circuit, 4 smoothing circuit, 5 control circuit, 6 DC power supply, 7 reference potential, 8 multilayer substrate, 8A first surface, 8D second surface, 11A, 11B, 11C, 11D primary-side coil, 12A, 12B, 12C, 12D secondary-side coil, 13, 14, 43 magnetic core, 21A, 21B, 21C, 21D, 21E, 21F switching element, 31A, 31B, 31C, 31D, 31E, 31F, 31G, 31H rectifying element, 41 smoothing capacitor, 42 smoothing coil, 73A, 73B, 73C, 73D, 73E, 73F, 73G fixing hole, 71 casing, 72 heat dissipation sheet, 74A, 74B, 74D, 74E fixture, 84A, 84B, 84C through hole, 81A, 81B, 81C, 81D conductor pattern layer, 81E, 81F, 81G, 81H, 81I, 81J, 81K, 81L, 81M, 81N via, 82A, 82B, 82C electric insulating layer, 85A, 85E third conductor pattern, 85B, 85F fourth conductor pattern, 85C, 85G second conductor pattern, 85D, 85H first conductor pattern, 86B, 86C sixth conductor pattern, 86D fifth conductor pattern, 92B seventh conductor pattern, 91A, 91B, 91C, 91D, 91E, 91F, 91G, 91H, 91J, 91K, 91L, 91M, 91N, 91P, 91Q, 91R, 91S, 91T, 91U, 91V, 91W, 91X thermal conductive member, 100 isolated converter.

The invention claimed is:

1. An isolated converter comprising:
a multilayer substrate having a first surface and a second surface positioned on a side opposite to the first surface, the multilayer substrate having a first through hole extending from the first surface to the second surface; and
a magnetic core partially passing through the first through hole,
the multilayer substrate including
a first conductor pattern formed at a position overlapping the magnetic core on the second surface when viewed from an orthogonal direction to the first surface,
a second conductor pattern formed between the first surface and the second surface at a position overlapping the magnetic core and the first conductor pattern when viewed from the orthogonal direction to the first surface,
at least one thermal conductive member formed on the first conductor pattern and having a portion disposed between the multilayer substrate and the magnetic core, and
an insulative heat-transferring member electrically insulating the first conductor pattern from the second conductor pattern, wherein
the multilayer substrate further includes a third conductor pattern formed at a position overlapping the magnetic core on the first surface when viewed from the orthogonal direction to the first surface,
the second conductor pattern and the third conductor pattern are electrically insulated from each other,
the first conductor pattern and the third conductor pattern are electrically connected with each other,
the multilayer substrate further includes a fourth conductor pattern formed between the first surface and the second surface at a position overlapping the magnetic core and at least one of the first conductor pattern and the third conductor pattern when viewed from the orthogonal direction, the third conductor pattern, the fourth conductor pattern, the second conductor pattern, and the first conductor pattern are formed in order in the orthogonal direction, the second conductor pattern and the fourth conductor pattern are electrically connected with each other, and a distance in the orthogonal direction between the third conductor pattern and the fourth conductor pattern and a distance in the orthogonal direction between the first conductor pattern and the second conductor pattern are shorter than a distance in the orthogonal direction between the second conductor pattern and the fourth conductor pattern.

2. The isolated converter according to claim 1, further comprising a cooler connected to at least part of the first conductor pattern.

3. The isolated converter according to claim 2, wherein a potential of the cooler is a reference potential of a circuit including the first conductor pattern.

4. The isolated converter according to claim 2, wherein the multilayer substrate further includes a fifth conductor pattern formed in a region on the second surface that at least partially overlaps the third conductor pattern but does not overlap the first conductor pattern and the fourth conductor pattern when viewed from the orthogonal direction, and a via formed from the first surface to the second surface and connecting the third conductor pattern with the fifth conductor pattern, and at least part of the fifth conductor pattern is connected to the cooler.

5. The isolated converter according to claim 4, wherein the multilayer substrate further includes a sixth conductor pattern formed between the first surface and the second surface and having a portion formed at a position overlapping at least one of the first conductor pattern and the third conductor pattern when viewed from the orthogonal direction, the fourth conductor pattern and the sixth conductor pattern are electrically insulated from each other, and the sixth conductor pattern is connected to the cooler.

6. The isolated converter according to claim 1, wherein the multilayer substrate further includes a plurality of thermal conductive members, the thermal conductive members include a plurality of first thermal conductive members formed spaced apart from each other by a gap portion on one of the first surface and the second surface, and a second thermal conductive member formed on the other of the first surface and the second surface, and the gap portion between the first thermal conductive members is formed so as to overlap the second thermal conductive member when viewed from the orthogonal direction.

7. The isolated converter according to claim 3, wherein the multilayer substrate further includes a fifth conductor pattern formed in a region on the second surface that at least partially overlaps the third conductor pattern but does not overlap the first conductor pattern and the fourth conductor pattern when viewed from the orthogonal direction, and a via formed from the first surface to the second surface and connecting the third conductor pattern with the fifth conductor pattern, and at least part of the fifth conductor pattern is connected to the cooler.

8. The isolated converter according to claim 7, wherein the multilayer substrate further includes a sixth conductor pattern formed between the first surface and the second surface and having a portion formed at a position overlapping at least one of the first conductor pattern and the third conductor pattern when viewed from the orthogonal direction, the fourth conductor pattern and the sixth conductor pattern are electrically insulated from each other, and the sixth conductor pattern is connected to the cooler.

9. The isolated converter according to claim 6, further comprising a cooler connected to at least part of the first conductor pattern.

10. The isolated converter according to claim 9, wherein a potential of the cooler is a reference potential of a circuit including the first conductor pattern, and at least part of the first conductor pattern is directly connected with the cooler.

11. The isolated converter according to claim 10, wherein the multilayer substrate further includes a fifth conductor pattern formed in a region on the second surface that at least partially overlaps the third conductor pattern but does not overlap the first conductor pattern and the fourth conductor pattern when viewed from the orthogonal direction, and a via formed from the first surface to the second surface and connecting the third conductor pattern with the fifth conductor pattern, and at least part of the fifth conductor pattern is connected to the cooler.

12. The isolated converter according to claim 11, wherein the multilayer substrate further includes a sixth conductor pattern formed between the first surface and the second surface and having a portion formed at a position overlapping at least one of the first conductor pattern and the third conductor pattern when viewed from the orthogonal direction, the fourth conductor pattern and the sixth conductor pattern are electrically insulated from each other, and the sixth conductor pattern is connected to the cooler.

13. The isolated converter according to claim 9, wherein the multilayer substrate further includes a fifth conductor pattern formed in a region on the second surface that at least partially overlaps the third conductor pattern but does not overlap the first conductor pattern and the fourth conductor pattern when viewed from the orthogonal direction, and a via formed from the first surface to the second surface and connecting the third conductor pattern with the fifth conductor pattern, and at least part of the fifth conductor pattern is connected to the cooler.

14. The isolated converter according to claim 13, wherein the multilayer substrate further includes a sixth conductor pattern formed between the first surface and the second surface and having a portion formed at a position overlapping at least one of the first conductor pattern and the third conductor pattern when viewed from the orthogonal direction, the fourth conductor pattern and the sixth conductor pattern are electrically insulated from each other, and the sixth conductor pattern is connected to the cooler.

* * * * *